(12) United States Patent
Dai et al.

(10) Patent No.: US 12,020,650 B2
(45) Date of Patent: Jun. 25, 2024

(54) DISPLAY SUBSTRATE, MANUFACTURING METHOD AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Jie Dai, Beijing (CN); Pengfei Yu, Beijing (CN); Huijuan Yang, Beijing (CN); Lu Bai, Beijing (CN); Huijun Li, Beijing (CN); Xiaofeng Jiang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/930,735

(22) Filed: Sep. 9, 2022

(65) Prior Publication Data
US 2023/0005432 A1  Jan. 5, 2023

Related U.S. Application Data

(63) Continuation of application No. 17/256,514, filed as application No. PCT/CN2020/079486 on Mar. 16, 2020, now Pat. No. 11,475,844.

(51) Int. Cl.
*G09G 3/3266* (2016.01)
*G11C 19/28* (2006.01)

(52) U.S. Cl.
CPC .......... *G09G 3/3266* (2013.01); *G11C 19/28* (2013.01); *G09G 2300/0426* (2013.01); *G09G 2310/0286* (2013.01)

(58) Field of Classification Search
CPC ........... G09G 3/3233; G09G 2320/043; G09G 2310/0262; G09G 2300/0861;
(Continued)

(56) References Cited

U.S. PATENT DOCUMENTS

2010/0026669 A1* 2/2010 Lee ...................... G09G 3/3677
257/E21.535
2013/0147524 A1  6/2013 Hachida et al.
(Continued)

FOREIGN PATENT DOCUMENTS

CN    104914641 A    9/2015
CN    107331348 A    11/2017
(Continued)

OTHER PUBLICATIONS

International Search Report and Written Opinion, English Translation.
(Continued)

*Primary Examiner* — Md Saiful A Siddiqui
(74) *Attorney, Agent, or Firm* — Brooks Kushman P.C.

(57) ABSTRACT

A display substrate includes a scanning driving circuit arranged on a base substrate. The scanning driving circuit includes a plurality of shift register units and a first voltage signal line extending in a first direction. At least one shift register unit includes an output capacitor and a first transistor, a first electrode thereof is coupled to the first voltage signal line, and a second electrode thereof is coupled to an electrode plate of the output capacitor. A maximum distance between an orthogonal projection of the first electrode/second electrode of the first transistor onto the base substrate and an orthogonal projection of the first voltage signal line/the electrode plate of the output capacitor onto the base
(Continued)

substrate is smaller than a first/second predetermined distance in a second direction, and the first direction intersects the second direction.

17 Claims, 10 Drawing Sheets

(58) Field of Classification Search
CPC ... G09G 2300/0842; G09G 2300/0819; G09G 2300/0426; G09G 2300/0876; G09G 2320/02; H01L 51/52; H01L 29/04; H01L 21/84; H01L 27/3265; H01L 27/3276; H01L 51/5203; H01L 51/50
See application file for complete search history.

(56) References Cited

U.S. PATENT DOCUMENTS

| | | | |
|---|---|---|---|
| 2015/0102303 | A1 | 4/2015 | Kim |
| 2017/0004784 | A1 | 1/2017 | Cao et al. |
| 2017/0187976 | A1 | 6/2017 | Cok |
| 2018/0240382 | A1* | 8/2018 | Choi ............... G09G 3/3696 |
| 2019/0233984 | A1 | 8/2019 | Tsukamoto et al. |
| 2019/0295472 | A1 | 9/2019 | Yang et al. |
| 2019/0304374 | A1* | 10/2019 | Wang ............... G09G 3/3233 |
| 2019/0304561 | A1 | 10/2019 | Wang |
| 2020/0035162 | A1 | 1/2020 | In |
| 2021/0335177 | A1 | 10/2021 | Feng et al. |

FOREIGN PATENT DOCUMENTS

| | | |
|---|---|---|
| CN | 108447448 A | 8/2018 |
| CN | 109712565 A | 5/2019 |
| CN | 109935197 A | 6/2019 |
| CN | 110164382 A | 8/2019 |
| JP | 2018016013 A | 2/2018 |
| JP | 2019131925 A | 8/2019 |

OTHER PUBLICATIONS

CN104914641A, English Abstract and U.S. Equivalent U.S. Pub. No. 2017/0004784.
CN107331348A, English Abstract and U.S. Equivalent U.S. Pub. No. 2019/0304561.
CN108447448A, English Abstract and Machine Translation.
CN109712565A, English Abstract and Machine Translation.
CN109935197A, English Abstract and U.S. Equivalent U.S. Pub. No. 2021/0335177.
CN110164382A, English Abstract and Machine Translation.
JP2018016013A, English Abstract and Machine Translation.
JP2019131925A, English Abstract and U.S. Equivalent U.S. Pub. No. 2019/0233984.
Non-final Rejection for U.S. Appl. No. 17/256,514, dated Jan. 20, 2021, 8 Pages.
International Search Report and Written Opinion for Application No. PCT/CN2020/079486, dated Dec. 17, 2020, 10 Pages.

* cited by examiner

DISPLAY SUBSTRATE, MANUFACTURING METHOD AND DISPLAY DEVICE

CROSS-REFERENCE TO RELATED APPLICATIONS

This application is a continuation application of U.S. application Ser. No. 17/256,514 filed on Dec. 28, 2020, which is the U.S. national phase of PCT Application No. PCT/CN2020/079486 filed on Mar. 16, 2020, which are incorporated herein by reference in their entireties.

TECHNICAL FIELD

The present disclosure relates to the field of display technology, in particular to a display substrate, a manufacturing method, and a display device.

BACKGROUND

Active-Matrix Organic Light-Emitting Diode (AMO-LED) display panel has been widely applied in various fields due to such advantages as low power consumption, low manufacture cost and wide gamut.

The AMOLED display panel includes a pixel circuit arranged at a display region and a scanning driving circuit arranged at a peripheral region. The pixel circuit includes a plurality of pixel sub-circuits arranged in an array form. The scanning driving circuit includes a plurality of shift register units each configured to provide a light emitting control signal to a corresponding pixel sub-circuit. Because the scanning driving circuit is arranged at the peripheral region of the AMOLED display panel, a bezel width of the AMOLED display panel depends on an arrangement mode of the scanning driving circuit.

SUMMARY

In one aspect, the present disclosure provides in some embodiments a display substrate, including a scanning driving circuit arranged on a base substrate. The scanning driving circuit includes a plurality of shift register units and a first voltage signal line extending in a first direction. At least one of the plurality of shift register units includes an output capacitor and a first transistor, a first electrode of the first transistor is coupled to the first voltage signal line, and a second electrode of the first transistor is coupled to an electrode plate of the output capacitor. A maximum distance between an orthogonal projection of the first electrode of the first transistor onto the base substrate and an orthogonal projection of the first voltage signal line onto the base substrate is smaller than a first predetermined distance in a second direction, a maximum distance between an orthogonal projection of the second electrode of the first transistor onto the base substrate and an orthogonal projection of the electrode plate of the output capacitor onto the base substrate is smaller than a second predetermined distance in the second direction, and the first direction intersects the second direction.

In a possible embodiment of the present disclosure, the first predetermined distance is greater than or equal to 20 µm and smaller than or equal to 30 µm, and the second predetermined distance is greater than or equal to 25 µm and smaller than or equal to 35 µm.

In a possible embodiment of the present disclosure, an orthogonal projection of a first electrode plate of the output capacitor onto the base substrate overlaps the orthogonal projection of the first voltage signal line onto the base substrate at a signal line overlapping region, and the first electrode plate of the output capacitor is coupled to the first voltage signal line through at least one signal line via hole in the signal line overlapping region. An electrode plate of the output capacitor coupled to the second electrode of the first transmission is a second electrode plate of the output capacitor, the at least one shift register unit further includes an electrode plate conductive connection member coupled to the second electrode of the first transistor, an orthogonal projection of the electrode plate conductive connection member onto the base substrate overlaps an orthogonal projection of the second electrode plate of the output capacitor onto the base substrate at an electrode plate overlapping region, and the electrode plate conductive connection member is coupled to the second electrode plate of the output capacitor through at least one electrode plate via hole in the electrode plate overlapping region.

In a possible embodiment of the present disclosure, the orthogonal projection of the first electrode plate of the output capacitor onto the base substrate at least partially overlaps the orthogonal projection of the second electrode plate of the output capacitor onto the base substrate.

In a possible embodiment of the present disclosure, the at least one shift register unit further includes a second transistor. An active layer of the first transistor and an active layer of the second transistor are formed by a continuous second semiconductor layer extending in the first direction, the active layer of the first transistor includes a first one of third conductive members, a third channel member and a second one of the third conductive members arranged sequentially in the first direction, the second one of the third conductive members is reused as a first one fourth conductive members, the active layer of the second transistor includes the first one of the fourth conductive members, a fourth channel member and a second one of the fourth conductive members arranged sequentially in the first direction, and the second electrode of the first transistor is reused as a second electrode of the second transistor.

In a possible embodiment of the present disclosure, the scanning driving circuit further includes a second voltage signal line arranged at a side of the first transistor away from the first voltage signal line, extending in the first direction, and arranged at a side of the first voltage signal line away from a display region.

In a possible embodiment of the present disclosure, the scanning driving circuit further includes a second voltage signal line arranged at a side of the first voltage signal line away from a display region, the at least one shift register unit further includes an input transistor, and the first transistor and the input transistor are arranged between the first voltage signal line and the second voltage signal line.

In a possible embodiment of the present disclosure, a second electrode of the input transistor is coupled to a ninth conductive connection member, and a gate electrode of the first transistor is coupled to the ninth conductive connection member so that the gate electrode of the first transistor is coupled to the second electrode of the input transistor.

In a possible embodiment of the present disclosure, the at least one shift register unit further includes a third node control transistor arranged between the first voltage signal line and the second voltage signal line, a second electrode of the input transistor is reused as a second electrode of the third node control transistor and coupled to a ninth conductive connection member, and a gate electrode of the first transistor is coupled to the ninth conductive connection member so that the gate electrode of the first transistor is coupled to the second electrode of the third node control transistor.

In a possible embodiment of the present disclosure, the at least one shift register unit further includes a second capacitor, the first transistor and the second transistor are arranged at a side of the first voltage signal line away from a display region, an orthogonal projection of a second electrode plate of the second capacitor onto the base substrate overlaps an orthogonal projection of the ninth conductive connection member onto the base substrate at a tenth overlapping region, the ninth conductive connection member is coupled to the second electrode plate of the second capacitor through a tenth via hole in the tenth overlapping region, and the gate electrode of the first transistor is coupled to the ninth conductive connection member so that the gate electrode of the first transistor is coupled to the second electrode plate of the second capacitor.

In a possible embodiment of the present disclosure, the at least one first shift register unit further includes a first node control transistor and a second capacitor, a gate electrode of the first node control transistor is coupled to a second electrode plate of the second capacitor, an orthogonal projection of a first electrode plate of the second capacitor onto the base substrate is located within an orthogonal projection of the second electrode plate of the second capacitor onto the base substrate, the first electrode plate of the second capacitor is of an L-like shape and includes a second horizontal electrode plate member, and an orthogonal projection of the gate electrode of the first node control transistor onto the base substrate and an orthogonal projection of the second horizontal electrode plate member onto the base substrate are arranged in the first direction.

In a possible embodiment of the present disclosure, the scanning driving circuit further includes a second voltage signal line extending in the first direction and arranged at a side of the first voltage signal line away from a display region, the first node control transistor is arranged between the second voltage signal line and the first voltage signal line, the first electrode plate of the second capacitor further includes a second vertical electrode plate member coupled to the second horizontal electrode plate member, and an orthogonal projection of the second vertical electrode plate member onto the base substrate partially overlaps an orthogonal projection of the second voltage signal line onto the base substrate.

In a possible embodiment of the present disclosure, the scanning driving circuit further includes a first clock signal line extending in the first direction and arranged at a side of the second voltage signal line away from the first voltage signal line, the at least one shift register unit includes an output circuit including an output transistor, the at least one shift register unit further includes a second conductive connection member arranged between a gate electrode of the output transistor and the second electrode plate of the second capacitor and coupled to the gate electrode of the output transistor and the second electrode plate of the second capacitor, the at least one shift register unit further includes a third conductive connection member coupled to the second electrode plate of the second capacitor, an orthogonal projection of the third conductive connection member onto the base substrate overlaps an orthogonal projection of the first clock signal line onto the base substrate at a sixth overlapping region, and the first clock signal line is coupled to the first electrode plate of the second capacitor through at least one sixth via hole in the sixth overlapping region.

In a possible embodiment of the present disclosure, the first node control transistor includes a second active pattern of a U-like shape, the second active pattern includes a first one of first node control channel members, a second one of the first node control channel members, a first one of first node control conductive members coupled to the first one of the first node control channel members, and a second one of the first node control conductive members coupled to the second one of the first node control channel members, the gate electrode of the first node control transistor includes a first gate electrode pattern and a second gate electrode pattern coupled to each other, the first gate electrode pattern corresponds to the first one of the first node control channel members, the second gate electrode pattern corresponds to the second one of the first node control channel members, the first one of the first node control conductive members corresponds to a second electrode of the first node control transistor, and the second one of the first node control conductive members corresponds to a first electrode of the first node control transistor.

In a possible embodiment of the present disclosure, the at least one shift register unit further includes a second node control transistor and a second capacitor connection transistor, and a second electrode of the second node control transistor is coupled to the second electrode of the first node control transistor through the fourth conductive connection member. The at least one shift register unit further includes a fifth conductive connection member coupled to a gate electrode of the second capacitor connection transistor, an orthogonal projection of the fifth conductive connection member onto the base substrate overlaps an orthogonal projection of the fourth conductive connection member onto the base substrate at a seventh overlapping region, and the fifth conductive connection member is coupled to the fourth conductive connection member through a seventh via hole in the seventh overlapping region.

In a possible embodiment of the present disclosure, the scanning driving circuit further includes a second voltage signal line arranged at a side of the first voltage signal line away from a display region, the first electrode of the first node control transistor is coupled to a sixth conductive connection member, a gate electrode of the second node control transistor is coupled to a seventh conductive connection member, an orthogonal projection of the sixth conductive connection member onto the base substrate overlaps an orthogonal projection of the seventh conductive connection member onto the base substrate at an eighth overlapping region, the sixth conductive connection member is coupled to the seventh conductive connection member through an eighth via hole in the eighth overlapping region, and a first electrode of the second node control transistor is coupled to the second voltage signal line.

In a possible embodiment of the present disclosure, the scanning driving circuit further includes a second clock signal line extending in the first direction, the gate electrode of the second node control transistor is further coupled to an eighth conductive connection member, an orthogonal projection of the eighth conductive connection member onto the base substrate overlaps an orthogonal projection of the second clock signal line onto the base substrate in a ninth overlapping region, and the eighth conductive connection member is coupled to the second clock signal line through a ninth via hole in the ninth overlapping region.

In a possible embodiment of the present disclosure, the scanning driving circuit includes a first clock signal line and a second voltage signal line each extending in the first direction, the second clock signal line is arranged between the first clock signal line and the second voltage signal line, or the first clock signal line is arranged between the second clock signal line and the second voltage signal line.

In a possible embodiment of the present disclosure, the at least one shift register unit further includes an input transistor, a first electrode of which is coupled to an input signal end, and a second electrode of which is coupled to a ninth conductive connection member. An orthogonal projection of the ninth conductive connection member onto the base substrate overlaps the orthogonal projection of the second electrode plate of the second capacitor onto the base substrate at a tenth overlapping region, and the ninth conductive connection member is coupled to the second electrode plate of the second capacitor through a tenth via hole in the tenth overlapping region.

In a possible embodiment of the present disclosure, the at least one shift register unit further includes a third node control transistor, a second capacitor connection transistor and an input transistor. A gate electrode of the third node control transistor is coupled to the first clock signal line, active layers of the input transistor, the third node control transistor and the second capacitor connection transistor are formed by a continuous third semiconductor layer, the active layer of the input transistor includes a first one of fifth conductive members, a fifth channel member and a second one of the fifth conductive members arranged sequentially in the first direction, the second one of the fifth conductive members is reused as a first one of sixth conductive members, the active layer of the third node control transistor includes the first one of the sixth conductive members, a sixth channel member and a second one of the sixth conductive members sequentially arranged in the first direction, the second one of the sixth conductive members is reused as a first one of seventh conductive members, and the active layer of the second capacitor connection transistor includes the first one of the seventh conductive members, a seventh channel member and a second one of the seventh conductive members sequentially arranged in the first direction.

In a possible embodiment of the present disclosure, the scanning driving circuit further includes a second voltage signal line, a first clock signal line, a second clock signal line and a signal output line, the second voltage line, the first clock signal line and the second clock signal line extend in the first direction, an orthogonal projection of the second voltage signal line onto the base substrate, an orthogonal projection of the first clock signal line onto the base substrate and an orthogonal projection of the second clock signal line onto the base substrate are arranged at a side of an orthogonal projection of the shift register unit onto the base substrate away from a display region of the display substrate, and the signal output line extends in the second direction.

In a possible embodiment of the present disclosure, the scanning driving circuit further includes a second voltage signal line, a third voltage signal line, a first clock signal line, a second clock signal line and a signal output line. The at least one shift register unit further includes an output transistor, an output resetting transistor, a first capacitor, a second capacitor, a second transistor, a first capacitor connection transistor, a second capacitor connection transistor, a first node control transistor, a second node control transistor, an input transistor, and a third node control transistor. A first electrode of the output resetting transistor is coupled to the first voltage signal line, a second electrode of the output transistor is coupled to the third voltage signal line, a second electrode plate of the output capacitor is coupled to a gate electrode of the output resetting transistor, a second electrode of the first transistor is coupled to the second electrode plate of the output transistor, a gate electrode of the first transistor is coupled to a second electrode of the third node control transistor, a second electrode of the second transistor is coupled to a first electrode plate of the first capacitor, a first electrode of the second transistor is coupled to a second electrode of the first capacitor connection transistor, a gate electrode of the second transistor is coupled to a gate electrode of the third node control transistor, gate electrode soft eh first capacitor connection transistor and the second capacitor connection transistor are coupled to a second electrode plate of the first capacitor, the second electrode of the first capacitor connection transistor is coupled to the first electrode plate of the first capacitor, a first electrode of the first capacitor connection transistor is coupled to the gate electrode of the second transistor, a first electrode of the second capacitor connection transistor is coupled to the first voltage signal line, the gate electrode of the second capacitor connection transistor is coupled to a second electrode of the second node control transistor, a second electrode of the second capacitor connection transistor is coupled to a first electrode of the third node control transistor, a first electrode of the first node control transistor is coupled to a gate electrode of the second node control transistor, a gate electrode of the first node control transistor is coupled to a second electrode plate of the second capacitor, the second electrode of the second node control transistor is coupled to a second electrode of the first node control transistor, the gate electrode of the second node control transistor is coupled to the second clock signal line, a first electrode of the second node control transistor is coupled to the second voltage signal line, a gate electrode of the input transistor is coupled to the gate electrode of the second node control transistor, a first electrode of the input transistor is coupled to an input signal end, a second electrode of the input transistor is coupled to the second electrode plate of the second capacitor, the gate electrode of the third node control transistor is coupled to the first clock signal line, a first electrode plate of the output capacitor is coupled to the first voltage signal line, the second electrode plate of the output capacitor is coupled to the gate electrode of the output resetting transistor, the second electrode plate of the second capacitor is coupled to a gate electrode of the output transistor, a first electrode plate of the second capacitor is coupled to the first clock signal line, and second electrodes of the output transistor and the output resetting transistor are coupled to the signal output line.

In a possible embodiment of the present disclosure, the first clock signal line, the second clock signal line and the second voltage signal line are arranged sequentially in a direction close to the display region, or the second clock signal line, the first clock signal line and the second voltage signal line are arranged sequentially in the direction close to the display region.

In a possible embodiment of the present disclosure, the first electrode plate of the first capacitor includes a first horizontal electrode plate member and a first vertical electrode plate member, the output transistor and the output resetting transistor are arranged between the first voltage signal line and the third voltage signal line, the output resetting transistor, the output transistor and the signal output line are arranged sequentially in the first direction, the second voltage signal line is arranged at a side of the first voltage signal line away from the third voltage signal line, the first capacitor, the first transistor, the second transistor, the first capacitor connection transistor, the second capacitor connection transistor, the first node control transistor, the second node control transistor, the input transistor and the third node control transistor are arranged between the first voltage signal line and the second voltage signal line, the first transistor, the second transistor and the first vertical electrode plate are arranged sequentially in the first direction, the input transistor, the third node control transistor, the second capacitor connection transistor and the first horizontal electrode plate member are arranged sequentially in the first direction, the second node control transistor and the first node control transistor are arranged sequentially in the first transistor, an orthogonal projection of the gate electrode of the first capacitor connector transistor onto the base substrate is arranged between an orthogonal projection of the second electrode plate of the first capacitor onto the base substrate and the orthogonal projection of the first voltage signal line onto the base substrate, an orthogonal projection of the gate electrode of the second transistor onto the base substrate is arranged between an orthogonal projection of the gate electrode of the third node control transistor onto the base substrate and an orthogonal projection of the first voltage signal line onto the base substrate, an orthogonal projection of the gate electrode of the first node control transistor onto the base substrate is arranged between an orthogonal projection of the second voltage signal line onto the base substrate and an orthogonal projection of an orthogonal projection of the first electrode plate of the first capacitor onto the base substrate, and a minimum distance between the orthogonal projection of the gate electrode of the first node control transistor onto the base substrate and the orthogonal projection of the second voltage signal line onto the base substrate in the second direction is greater than a minimum distance between an orthogonal projection of the gate electrode of the second capacitor connection transistor and the orthogonal projection of the second voltage signal line onto the base substrate in the second direction.

In a possible embodiment of the present disclosure, an orthogonal projection of the first electrode plate of the output capacitor onto the base substrate overlaps the orthogonal projection of the first voltage signal line onto the base substrate at a signal line overlapping region, an orthogonal projection of the second electrode plate of the output capacitor onto the base substrate partially overlaps the orthogonal projection of the first voltage signal line onto the base substrate, an orthogonal projection of the first electrode plate of the second capacitor is located within an orthogonal projection of the second electrode plate of the second capacitor onto the base substrate, the first electrode plate of the second capacitor is of an L-like shape and includes a second horizontal electrode plate member and a second vertical electrode plate member, the gate electrode of the first node control transistor and the second horizontal electrode plate are arranged in the first direction, and an orthogonal projection of the second vertical electrode plate member onto the base substrate partially overlaps an orthogonal projection of the second voltage signal line onto the base substrate.

In a possible embodiment of the present disclosure, the at least one shift register unit further includes a signal output line, an output transistor and an output resetting transistor, second electrodes of the output transistor and the output resetting transistor are coupled to the signal output line extending in the second direction, the display substrate further includes a plurality of rows of pixel circuits on the base substrate and each pixel circuit comprises a light emitting control end, the shift register units of the scanning driving circuit correspond to the plurality of rows of pixel circuits in a one-to-one manner, and the signal output line of the shift register unit is coupled to the light emitting control ends of a corresponding row of pixel circuits and configured to apply a light emitting control signal to the light emitting control ends of the corresponding row of pixel circuits.

In another aspect, the present disclosure provides in some embodiments a method of manufacturing a display substrate, including forming a first voltage signal line and a scanning driving circuit on a base substrate, the first voltage signal line extending in a first direction, the scanning driving circuit including a plurality of shift register units, at least one of the plurality of shift register units including an output capacitor and a first transistor. The method further includes forming the output capacitor and the first transistor in such a manner that a first electrode of the first transistor is coupled to the first voltage signal line and a second electrode of the first transistor is coupled to an electrode plate of the output capacitor. A maximum distance between an orthogonal projection of the first electrode of the first transistor onto the base substrate and an orthogonal projection of the first voltage signal line onto the base substrate is smaller than a first predetermined distance in a second direction, a maximum distance between an orthogonal projection of the second electrode of the first transistor onto the base substrate and an orthogonal projection of the electrode plate of the output capacitor onto the base substrate is smaller than a second predetermined distance in the second direction, and the first direction intersects the second direction.

In a possible embodiment of the present disclosure, the first predetermined distance is greater than or equal to 20 μm and smaller than or equal to 30 μm, and the second predetermined distance is greater than or equal to 25 μm and smaller than or equal to 35 μm.

In a possible embodiment of the present disclosure, the at least one shift register unit further includes a second transistor. The forming the first transistor and the second transistor includes: forming a second semiconductor layer extending in the first direction; forming a first gate metal layer at a surface of the second semiconductor layer away from the base substrate, and patterning the first gate metal layer to form a gate electrode of the first transistor and a gate electrode of the second transistor; and doping a portion of the second semiconductor layer not covered by the gate electrodes of the first transistor and the second transistor with the gate electrodes as a mask, so as to enable the portion of the second semiconductor layer not covered by the gate electrodes to form conductive members, and enable a portion of the second semiconductor layer covered by the gate electrodes to form channel members. The second semiconductor layer includes a first one of third conductive members, a third channel member, a second one of the third conductive members, a fourth channel member and a second one of fourth conductive members arranged sequentially in the first direction, the second one of the third conductive members is reused as a first one of the fourth conductive members, the first one of the third conductive members is reused as the first electrode of the first transistor, the second one of the third conductive members is reused as the second electrode of the first transistor, and the second one of the fourth conductive members is reused as the second electrode of the second transistor.

In a possible embodiment of the present disclosure, the electrode plate of the output capacitor coupled to the second electrode of the first transistor is a second electrode plate of the output capacitor. The forming the output capacitor includes: patterning the first gate metal layer to form the second electrode plate of the output capacitor; forming a second gate metal layer at a surface of the first gate metal layer away from the second semiconductor layer, and patterning the second gate metal layer to form a first electrode plate of the output capacitor; and forming a source-drain metal layer at a surface of the second gate metal layer away from the first gate metal layer, and patterning the source-drain metal layer to form an electrode plate conductive connection member, the first voltage signal line and a second voltage signal line. An orthogonal projection of a first electrode plate of the output capacitor onto the base substrate overlaps the orthogonal projection of the first voltage signal line onto the base substrate at a signal line overlapping region, and the first electrode plate of the output capacitor is coupled to the first voltage signal line through at least one signal line via hole in the signal line overlapping region. An orthogonal projection of the electrode plate conductive connection member onto the base substrate overlaps an orthogonal projection of the second electrode plate of the output capacitor onto the base substrate at an electrode plate overlapping region, and the electrode plate conductive connection member is coupled to the second electrode plate of the output capacitor through at least one electrode plate via hole in the electrode plate overlapping region. The second voltage signal line extends in the first direction, the first transistor and the second transistor are arranged between the first voltage signal line and the second voltage signal line, and the second voltage signal line is arranged at a side of the first voltage signal line away from a display region.

In yet another aspect, the present disclosure provides in some embodiments a display device including the above-mentioned display substrate.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
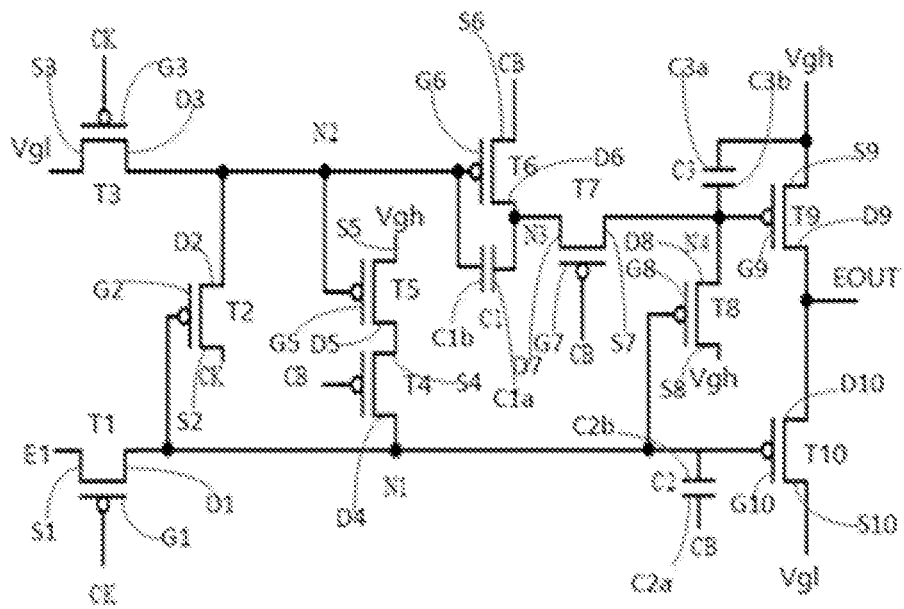
FIG. 1 is a circuit diagram of at least one shift register unit in a display substrate according to one embodiment of the present disclosure.

As shown in FIG. 1, the present disclosure provides in some embodiments a display substrate which includes a scanning driving circuit at a peripheral region of the display substrate. The scanning driving circuit includes a first voltage signal line VGH, a second voltage signal line VGL1, a third voltage signal line VGL2, a first clock signal line CB, a second clock signal line CK, a signal output line EOUT, and a plurality of shift register units.

As shown in FIG. 1, at least one of the plurality of shift register units may include an output resetting transistor T9, an output transistor T10, an output capacitor C3, a first capacitor C1, a second capacitor C2, a first transistor T8, a second transistor T7, a first capacitor connection transistor T6, a second capacitor connection transistor T5, a first node control transistor T2, a second node control transistor T3, an input transistor T1, and a third node control transistor T4.

A gate electrode G9 of the output resetting transistor T9 may be coupled to a second electrode plate C3b of the output capacitor C3, and a first electrode S9 of the output resetting transistor T9 may receive a high voltage signal Vgh.

A gate electrode G10 of the output transistor T10 may be coupled to a second electrode plate C2b of the second capacitor C2, and a first electrode S10 of the output transistor T10 may receive a low voltage signal Vgl.

A second electrode D9 of the output resetting transistor T9 and a second electrode D10 of the output transistor T10 may be coupled to the signal output line EOUT.

A second electrode D8 of the first transistor T8 may be coupled to the second electrode plate C3b of the output capacitor C3, a first electrode S8 of the first transistor T8 may receive the high voltage signal Vgh, and a gate electrode G8 of the first transistor T8 may be coupled to a second electrode D4 of the third node control transistor T4.

A second electrode D7 of the second transistor T7 may be coupled to a first electrode plate C1a of the first capacitor C1, a first electrode S7 of the second transistor T7 may be coupled to the second electrode plate C3b of the output capacitor C3, and a gate electrode G7 of the second transistor T7 may be coupled to a gate electrode G4 of the third node control transistor T4.

A gate electrode G6 of the first capacitor connection transistor T6 and a gate electrode G5 of the second capacitor connection transistor T5 may be coupled to a second electrode plate C1b of the first capacitor C1, a second electrode D6 of the first capacitor connection transistor T6 may be coupled to the first electrode plate C1a of the first capacitor C1, and a first electrode S6 of the first capacitor connection transistor T6 may be coupled to the gate electrode G7 of the second transistor T7.

A first electrode S5 of the second capacitor connection transistor T5 may be coupled to the first voltage signal line VGH, the gate electrode G5 of the second capacitor connection transistor T5 may be coupled to a second electrode D3 of the second node control transistor T3, and a second electrode D5 of the second capacitor connection transistor T5 may be coupled to a first electrode S4 of the third node control transistor T4.

A first electrode S2 of the first node control transistor T2 may be coupled to a gate electrode G3 of the second node control transistor T3, and a gate electrode G2 of the first node control transistor T2 may be coupled to the second electrode plate C2b of the second capacitor C2.

The second electrode D3 of the second node control transistor T3 may be coupled to the second node D2 of the first node control transistor T2, the gate electrode G3 of the second node control transistor T3 may be coupled to the second clock signal line CK, and a first electrode S3 of the second node control transistor T3 may receive the low voltage signal Vgl.

A gate electrode G1 of the input transistor T1 may be coupled to the gate electrode G3 of the second node control transistor T3, a first electrode S1 of the input transistor T1 may be coupled to an input signal end E1, and a second electrode D1 of the input transistor T1 may be coupled to the second electrode plate C2b of the second capacitor C2.

A gate electrode G4 of the third node control transistor T4 may be coupled to the first clock signal line CB.

A first electrode plate C3a of the output capacitor C3 may receive the high voltage signal Vgh, and the second electrode plate C3b of the output capacitor C3 may be coupled to the gate electrode G9 of the output resetting transistor T9.

The second electrode plate C2b of the second capacitor C2 may be coupled to the gate electrode G10 of the output transistor T10, and a first electrode plate C2a of the second capacitor C2 may be coupled to the first clock signal line CB.

For the shift register unit in FIG. 1, all the transistors may be, but not limited to, p-type transistors.

In the embodiments of the present disclosure, the shift register unit in FIG. 1 may be, but not limited to, a light emitting control scanning driving circuit.

In the embodiments of the present disclosure, the first electrode of each transistor may be a source electrode and the second electrode thereof may be a drain electrode, or the first electrode of each transistor may be a drain electrode and the second electrode thereof may be a source electrode.

In FIG. 1, N1 represents a first node, N2 represents a second node, N3 represents a third node, and N4 represents a fourth node.

Figure 2A:
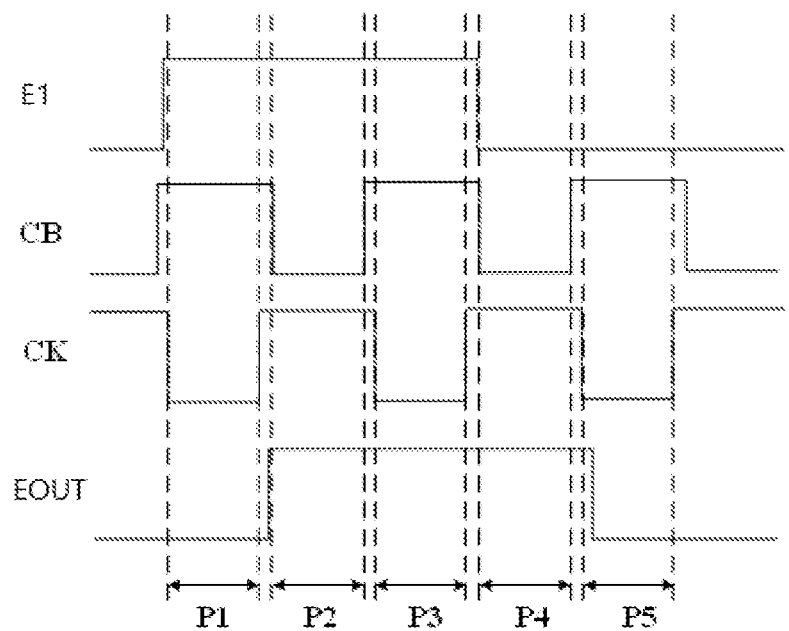
FIG. 2A is a time sequence diagram of the shift register unit in FIG. 1.

As shown in FIG. 2A, during the operation of the shift register unit in FIG. 1, at a first phase P1, a low level may be inputted to CK so as to turn on T1 and T3. An input signal at a high level from E1 may be applied to the first node N1 through T1 in an on state, so as to change a potential at the first node N1 to be a high level, thereby to turn off T2, T8 and T10. In addition, Vgl may be applied to the second node N2 through T3 in the on state, so as to change a potential at the second node N2 to be a low level, thereby to turn on T5 and T6. A high level may be inputted to CB, so as to turn off T7. Furthermore, due to an energy storage effect of C3, a potential at the fourth node N4 may be maintained at a high level, so as to turn off T9. At the first phase P1, because T9 and T10 are turned off, EOUT may output a low level.

At a second phase P2, a low level may be inputted to CB, so as to turn on T4 and T7. A high level may be inputted to the first clock signal line CK, so as to turn off T1 and T3. Due to the energy storage effect of the first capacitor C1, the potential at the second node N2 may be maintained at the low level at the previous phase, so as to turn on T5 and T6. Vgh may be applied to the first node N1 through T5 and T4 each in the on state, so as to maintain the potential at the first node N1 to be at the high level at the previous phase, thereby to turn off T2, T8 and T10. In addition, the low level from CB may be applied to the fourth node N4 through T6 and T7 each in the on state, so as to change the potential at the fourth node N4 to be a low level, thereby to turn on T9. At this time, EOUT may output the high voltage signal Vgh.

At a third phase P3, a low level may be inputted to CK, so as to turn on T1 and T3. A high level may be inputted to CB, so as to turn off T4 and T7. Due to the energy storage effect of C3, the potential at the fourth node N4 may be maintained at the low level at the previous phase, so as to maintain T9 in the on state. At this time, EOUT may output the high voltage signal Vgh.

At a fourth phase P4, a high level may be inputted to CK, so as to turn off T1 and T3. A low level may be inputted to CB, so as to turn on T4 and T7. Due to the energy storage effect of the second capacitor C2, the potential at the first node N1 may be maintained at the high level at the previous phase, so as to turn off T2, T8 and T10. Due to the energy storage effect of the first capacitor C1, the potential at the second node N2 may be continuously maintained at the low level at the previous phase, so as to turn on T5 and T6. In addition, the low voltage signal from CB may be applied to the fourth node N4 through T6 and T7 in the on state, so as to change the level at the fourth node N4 to be a low level, thereby to turn on T9 and output the high voltage Vgh through T9 in the on state. At this time, EOUT may output the high voltage signal Vgh.

At a fifth phase P5, a low voltage signal may be inputted to CK, so as to turn on T1 and T3. A high voltage signal may be inputted to CB, so as to turn off T4 and T7. An input signal at a low level from E1 may be applied to the first node N1 through T1 in the on state, so as to change the potential at the first node N1 to be a low level, thereby to turn on T2, T8 and T10. A second clock signal at a low level may be applied to the second node N2 through T2 in the on state, so as to further pull down the potential at the second node N2 and maintain the potential at the second node N2 to be the low level at the previous phase, thereby to turn on T5 and T6. In addition, Vgh may be applied to the fourth node N4 through T8 in the on state, so as to change the potential at the fourth node N4 to be a high voltage, thereby to turn off T9. Vgl may be outputted through T10 in the on state. At this time, EOUT may output the low voltage signal Vgl.

Figure 2B:
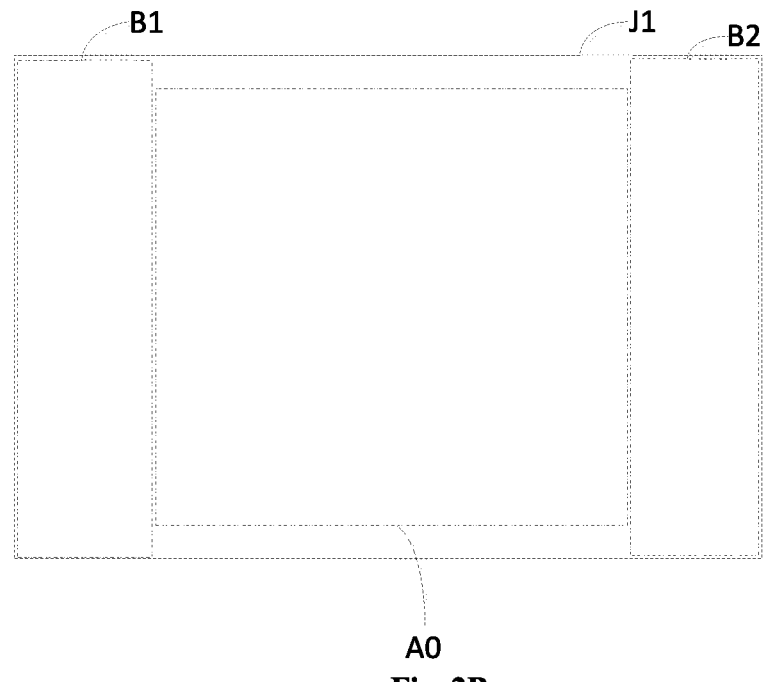
FIG. 2B is a schematic view showing the division of regions of the display substrate according to one embodiment of the present disclosure.

In FIG. 2B, J1 represents a display substrate, A0 represents a display region, B1 represents a first peripheral region, and B2 represents a second peripheral region.

A plurality of light emitting control lines, a plurality of gate lines and a plurality of data lines may be arranged at the display region A0 of the display substrate J1, and the plurality of gate lines may cross the plurality of data lines to define a plurality of subpixels.

A scanning driving circuit may be arranged at the first peripheral region B1 and/or the second peripheral region B2, and include a plurality of shift register units corresponding to the plurality of light emitting control lines in one-to-one manner. A signal output line of each shift register may be coupled to a corresponding light emitting control line, and configured to provide a light emitting control signal to the corresponding light emitting control line.

During the implementation, one light emitting control line may be coupled to light emitting control ends of pixel circuits in a corresponding row.

In a possible embodiment of the present disclosure, the display substrate may further includes a plurality of pixel circuits arranged in rows on the base substrate, and each pixel circuit may include the light emitting control end. The shift register units in the scanning driving circuit may corresponding to the rows of the pixel circuits in one-to-one manner. The signal output line of the shift register unit may be coupled to the light emitting control ends of the pixel circuits in a corresponding row, and configured to provide a light emitting control signal to the light emitting control ends of the pixel circuits in the corresponding row.

In the embodiments of the present disclosure, each pixel circuit may be arranged at an active display region of the display substrate, and the scanning driving circuit may be arranged at the peripheral region of the display substrate.

Figure 2C:
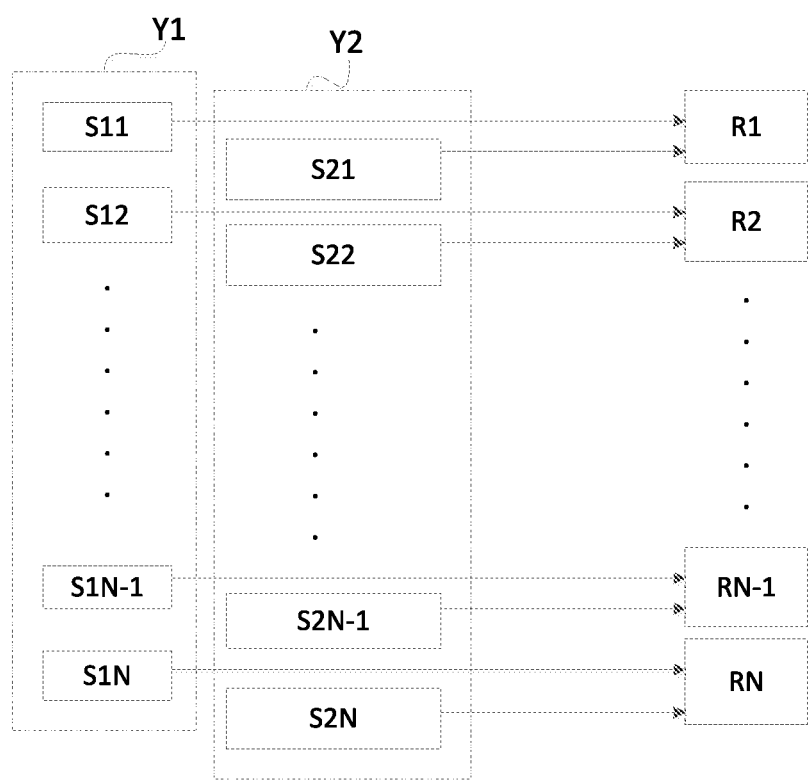
FIG. 2C is a schematic view showing a connection relationship between a scanning driving circuit and pixel driving circuits of the display substrate according to one embodiment of the present disclosure.

In FIG. 2C, Y1 represents the scanning driving circuit, S11 represents a first stage of shift register unit in the scanning driving circuit S1, S12 represents a second stage of shift register unit in the scanning driving circuit S1, S1N-1 represents an $(N-1)^{th}$ stage of shift register unit in the scanning driving circuit S1, and S1N represents an $N^{th}$ stage of shift register unit in the scanning driving circuit S1, where N is an integer greater than 3.

In FIG. 2C, R1 represents the pixel circuits in a first row, R2 represents the pixel circuits in a second row, RN-1 represents the pixel circuits in an $(N-1)^{th}$ row, and RN represents the pixel circuits in an $N^{th}$ row. S11 may correspond to R1, S12 may correspond o R2, S1N-1 may correspond to RN-1, and S1N may correspond to RN. S11 is configured to provide a first light emitting control signal to R1, S12 is configured to provide a second light emitting control signal to R2, S1N-1 is configured to provide an $(N-1)^{th}$ light emitting control signal to R1N-1, and S1N is configured to provide an $N^{th}$ light emitting control signal to R1N.

As shown in FIG. 2C, at the peripheral region, the display substrate may further include a gate driver circuit which includes a plurality of stages of gate driving units corresponding to the rows of pixels respectively and each configured to provide a corresponding gate driving signal to a correspond row of pixels.

In FIG. 2C, Y2 represents the gate driver circuit, S21 represents gate driving units in a first row in the gate driver circuit, S22 represents gate driving units in a second row in the gate driver circuit, S2N-1 represents gate driving units in an $(N-1)^{th}$ row in the gate driver circuit, and S2N represents gate driving units in an $N^{th}$ row in the gate driver circuit.

Figure 2D:
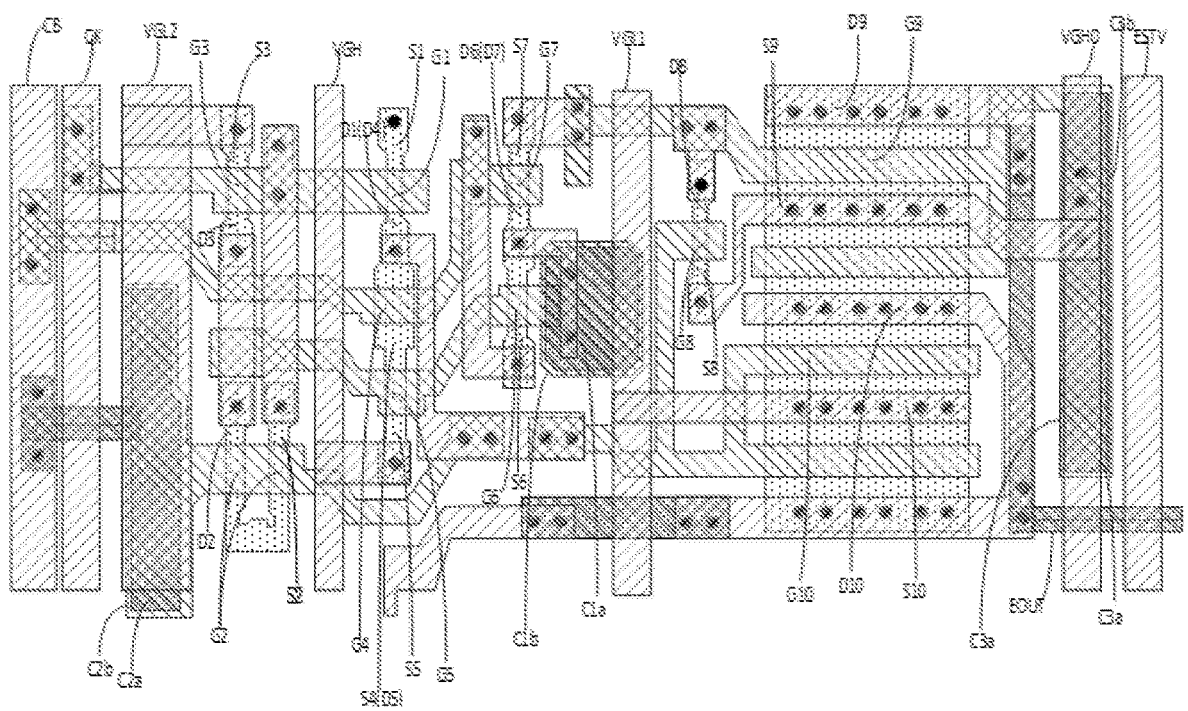
FIG. 2D is schematic view showing the layout of the shift register unit according to one embodiment of the present disclosure.

As shown in FIG. 2D, the first voltage signal line VGH is configured to provide the high voltage signal Vgh, the second voltage signal line VGL1 and the third voltage signal line VGL2 are configured to provide the low voltage signal Vgl, and the fourth voltage signal line VGH0 is configured to provide the high voltage signal Vgh.

As shown in FIG. 2D, ESTV, VGH0, VGL1, VGH, VGL2, CK and CB may be arranged in a direction away from the display region, and may each extend in the first direction. T8, T9 and T10 may be arranged between VGL1 and VGH0, T9 and T10 may be arranged in a first direction, and T8 may be arranged between T9 and VGL1. T6, T7, C1, T1, T4 and T5 may be arranged between VGH and VGL1, C1 may be arranged between VGL1 and T6, T4 may be arranged between VGL1 and T6, T7 and T6 may be arranged sequentially in the first direction, T1, T4 and T5 may be arranged sequentially in the first direction, T2 and T3 may be arranged between VGL2 and VGH, and T3 and T2 may be arranged sequentially in the first direction. An orthogonal projection of C3 onto the base substrate may partially overlap an orthogonal projection of VGH0 onto the base substrate, and an orthogonal projection of C2 onto the base substrate may partially overlap an orthogonal projection of VGL2 onto the base substrate.

In FIG. 2D, ESTV represents a start signal line, D1 is reused as D4, S4 is reused as D5, and D6 is reused as D7.

Figure 3:
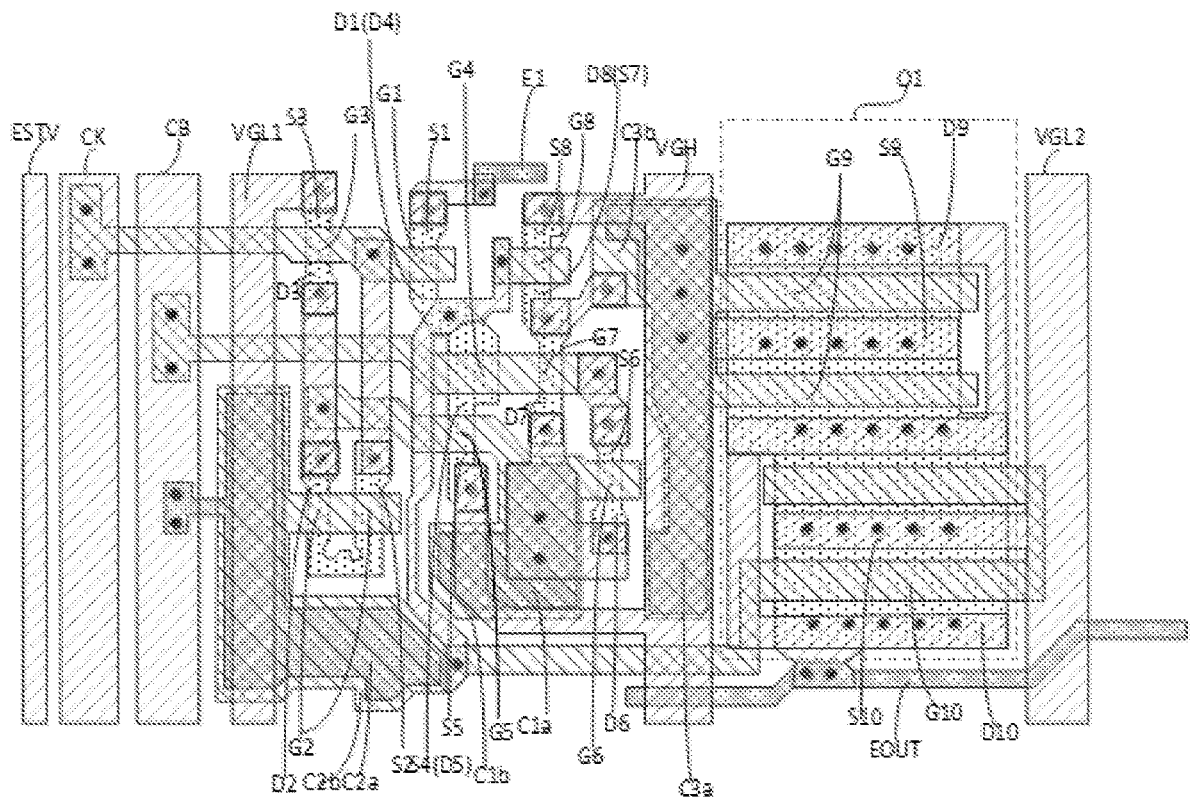
FIG. 3 is another schematic view showing the layout of the shift register unit according to one embodiment of the present disclosure.

In FIGS. 2D and 3, G1 represents the gate electrode of T1, S1 represents the first electrode of T1, D1 represents the second electrode of T1, G2 represents the gate electrode of T2, S2 represents the first electrode of T2, D2 represents the second electrode of T2, G3 represents the gate electrode of T3, S3 represents the first electrode of T3, D3 represents the second electrode of T3, G4 represents the gate electrode of T4, S4 represents the first electrode of T4, D4 represents the second electrode of T4, G5 represents the gate electrode of T5, S5 represents the first electrode of T5, D5 represents the second electrode of T, G6 represents the gate electrode of T6, S6 represents the first electrode of T6, D6 represents the second electrode of T6, G7 represents the gate electrode of T7, S7 represents the first electrode of T7, D7 represents the second electrode of T7, G8 represents the gate electrode of T8, S8 represents the first electrode of T8, D8 represents the second electrode of T8, G9 represents the gate electrode of T9, S9 represents the first electrode of T9, D9 represents the second electrode of T9, G10 represents the gate electrode of T10, S10 represents the first electrode of T10, and D10 represents the second electrode of T10.

In FIG. 2D, ESTV represents the start signal line.

In a layout mode of the gate driving circuit in FIG. 2D, due to the use of two signal lines for providing the high voltage signal, the signal lines are connected in a disorganized manner, and the arrangement of EOUT fails to make full use of a space between T10 in an $n^{th}$ stage of shift register unit and the output resetting transistor in an $(n+1)^{th}$ stage of shift register unit. In addition, the arrangement of C1 fails to make full use of a space between the gate electrode of T5 and a second conductive connection member, and the arrangement of C2 fails to make full use of a space between T2 and a next stage of shift register unit. Hence, the shift register unit has a relatively large transverse width, and it is adverse to a narrow bezel of the display substrate.

The shift register unit in FIG. 2D may be an n$^{th}$ stage of shift register unit of the scanning driving circuit, where n is a positive integer.

Based on the above problem, it is found that, through adjusting layout modes of the transistors in the shift register unit, it is able to reduce an area occupied by the shift register unit, thereby to reduce a bezel width of the display substrate.

In a layout mode as shown in FIG. 3, the first voltage signal line VGH is configured to provide the high voltage signal Vgh, and the second voltage signal line VGL1 and the third voltage signal line VGL2 are configured to provide the low voltage signal Vgl. In the embodiments of the present disclosure, one signal line for providing the high voltage signal Vgh may be reduced, and VGH may be arranged between VGL1 and VGL2, so as to facilitate the layout.

As compared with FIG. 2D, in FIG. 3, the fourth voltage signal line VGH0 may be removed, merely the first voltage signal line VGH, the second voltage signal line VGL1 and the third voltage signal line VGL2 may be adopted, and VGH may be arranged between VGL1 and VGL2.

As shown in FIG. 3, the first electrode S9 of the output resetting transistor T9 may be coupled to the first voltage signal line VGH, the first electrode S10 of the output transistor T10 may be coupled to the third voltage signal line VGL2, the first electrode S8 of the first transistor T8 may be coupled to the first voltage signal line VGH, the first electrode S5 of the second capacitor connection transistor T5 may be coupled to the first voltage signal line VGH, the first electrode S3 of the second node control transistor T3 may be coupled to the second voltage signal line VGL1, and the first electrode plate C3a of the output capacitor C3 may be coupled to the first voltage signal line VGH.

As shown in FIG. 3, when the shift register unit with the above-mentioned structure is arranged at the peripheral region of the display substrate, the third voltage signal lines VGL2, the first voltage signal line VGH and the second voltage signal line VGL1 may be arranged sequentially in the direction away from the display region of the display substrate. The third voltage signal lines VGL2, the first voltage signal line VGH and the second voltage signal line VGL1 may each extend in the first direction.

Further, the first clock signal line CB, the second clock signal line CK and the start voltage signal line ESTV may be arranged at a side of the second voltage signal line VGL1 away from the first voltage signal line VGH. The first clock signal line CB, the second clock signal line CK and the start voltage signal line ESTV may be arranged sequentially in a second direction away from the display region. The first clock signal line CB, the second clock signal line CK and the start voltage signal line ESTV may each extend in the first direction.

The output resetting transistor T9 and the output transistor T10 may be arranged between the first voltage signal line VGH and the third voltage signal line VGL2. The output resetting transistor T9, the output transistor T10 and the signal output line EOUT may be arranged sequentially in the first direction.

The first capacitor C1, the first transistor T8, the second transistor T7, the first capacitor connection transistor T6, the second capacitor connection transistor T5, the first node control transistor T2, the second node control transistor T3, the input transistor T1 and the third node control transistor T4 may be arranged between the first voltage signal line VGH and the second voltage signal line VGL1.

The first transistor T8, the second transistor T7 and the first capacitor C1 may be arranged sequentially in the first direction, the input transistor T1, the third node control transistor T4, the second capacitor connection transistor T5 and the first capacitor C1 may be arranged sequentially in the first direction, and the second node control transistor T3 and the first node control transistor T2 may be arranged sequentially in the first direction.

The second transistor T7 and the third node control transistor T4 may be arranged sequentially in the second direction, the first capacitor connection transistor T6 and the second capacitor connection transistor T5 may be arranged sequentially in the second direction, and the first transistor T8, the input transistor T1 and the second node control transistor T3 may be arranged in the second direction. In addition, an active pattern of the first node control transistor T2 may be of a U-like shape, so that T2 may be of a double-gate structure.

In a possible embodiment of the present disclosure, an input signal end of the first stage of shift register unit of the scanning driving circuit may be coupled to the start signal line ESTV, and the input signal end may be an end coupled to the first electrode S1 of the input transistor T1.

In a possible embodiment of the present disclosure, the first direction may intersect the second direction. For example, the first direction may be, but not limited to, perpendicular to the second direction.

To be specific, an angle between the second direction and the first direction may be set according to the practical need. For example, the second direction may be perpendicular to the first direction.

In a possible embodiment of the present disclosure, a position of the first clock signal line CB and a position of the second clock signal line CK may be, but not limited to, interchanged.

For example, in the layout mode in FIG. 3, the first direction may be, but not limited to, a longitudinal direction from top to bottom, and the second direction may be, but not limited to, a horizontal direction from right to left.

In actual use, a width of each signal line may mainly affect a resistance. The signal line with a large width may have a small resistance, so the signal may be outputted stably. The first voltage signal line VGH, the second voltage signal line VGL1 and the third voltage signal line VGL2 may each provide a direct-current voltage, which is less affected by a line width. However, the first clock signal line CB and the second clock signal line CK may each provide a clock signal, and when a potential of the clock signal is switched from a high voltage to a low voltage, the potential of the clock signal applied to the clock signal line with a small resistance may rapidly reach the low voltage. Hence, in the embodiments of the present disclosure, each of the first clock signal line CB and the second clock signal line CK may be provided with a large line width.

In a possible embodiment of the present disclosure, the display substrate may include a scanning driving circuit arranged on the base substrate and including a plurality of shift register units. The scanning driving circuit may further include a first voltage signal line extending in a first direction. At least one of the plurality of shift register units may include an output capacitor and a first transistor. A first electrode of the first transistor may be coupled to the first voltage signal line, and a second electrode thereof may be coupled to an electrode plate of the output capacitor. A maximum distance between an orthogonal projection of the first electrode of the first transistor onto the base substrate and an orthogonal projection of the first voltage signal line onto the base substrate may be smaller than a first predetermined distance in a second direction, a maximum distance between an orthogonal projection of the second electrode of the first transistor onto the base substrate and an orthogonal projection of the electrode plate of the output capacitor onto the base substrate may be smaller than a second predetermined distance in the second direction, and the first direction may intersect the second direction.

In the embodiments of the present disclosure, the first transistor may be arranged at a side of the first voltage signal line away from the third voltage signal line, and the orthogonal projection of the electrode plate onto the base substrate may partially overlap the orthogonal projection of the first voltage signal line onto the base substrate, so as to reduce a distance between the first electrode of the first transistor and the first voltage signal line, reduce a distance between the second electrode of the first transistor and a second electrode plate of the output capacitor, and enable the first transistor to be coupled to the first voltage signal line and the second electrode plate of the output capacitor conveniently, thereby to provide a compact space as well as a reasonable layout.

In the embodiments of the present disclosure, when the maximum distance between the orthogonal projection of the first electrode of the first transistor onto the base substrate and the orthogonal projection of the first voltage signal line onto the base substrate is smaller than the first predetermined distance in the second direction and the maximum distance between the orthogonal projection of the second electrode of the first transistor onto the base substrate and the orthogonal projection of the second electrode plate of the output capacitor onto the base substrate is smaller than the second predetermined distance in the second direction, it is able for the first transistor to be arranged close to the first voltage signal line and the output capacitor, thereby to reduce a transverse width of the shift register unit and provide a narrow bezel.

In a possible embodiment of the present disclosure, the first predetermined distance and the second predetermined distance may be set according to the practical need. For example, the first predetermined distance may be greater than or equal to 20 μm and smaller than or equal to 30 μm, and the second predetermined distance may be greater than or equal to 25 μm and smaller than or equal to 35 μm.

As shown in FIG. 3, an orthogonal projection of the first electrode plate C3a of the output capacitor C3 onto the base substrate may overlap the orthogonal projection of the first voltage signal line VGH onto the base substrate at a signal line overlapping region, and an orthogonal projection of the second electrode plate C3b of the output capacitor C3 onto the base substrate may partially overlap the orthogonal projection of the first voltage signal line VGH onto the base substrate, and an orthogonal projection of the first electrode plate C2a of the second capacitor C2 onto the base substrate may be located within an orthogonal projection of the second electrode plate C2b of the second capacitor C2 onto the base substrate. The first electrode plate C2a of the second capacitor C2 may be of an L-like shape.

As shown in FIG. 3, a transverse portion of the first electrode plate of C2 may be arranged between T2 of an $n^{th}$ stage of shift register unit and a second node control transistor of an $(n+1)^{th}$ stage of shift register unit, so as to make full use of a space between T2 of the $n^{th}$ stage of shift register unit and the second node control transistor of the $(n+1)^{th}$ stage of shift register unit. In addition, the transverse portion of the first electrode plate of C1 may be arranged between the gate electrode of T5 and a second conductive connection member L2, so as to make full use of a space between the gate electrode of T5 and the second conductive connection member L2.

In the layout mode in FIG. 3, the output resetting transistor T9 may be coupled to the first voltage signal line VGH, and the output transistor T10 may be coupled to the third voltage signal line VGL2. Hence, the output resetting transistor T9 and the output transistor T10 may be arranged between the first voltage signal line VGH and the third voltage signal line VGL2, and the signal output line EOUT may be arranged in such a manner as to make full use of a space between T10 of the $n^{th}$ stage of shift register unit and the output resetting transistor of the $(n+1)^{th}$ stage of shift register unit, so that T9 and T10 may be arranged between VGH and VGL2. In addition, no signal line or member of the other transistor may be arranged between the first voltage signal line VGH and an output circuit (including T9 and T10), and no signal line or member of the other transistor may be arranged between the third voltage signal line VGL2 and the output circuit (including T9 and T10), so as to reduce distances from VGH to T9 and T10, and reduce distances from VGL2 to T9 and T10, thereby to reduce the transverse width of the shift register unit.

In the embodiments of the present disclosure, the shift register unit in FIG. 3 may be an $n^{th}$ stage of shift register unit in the scanning driving circuit, where n is a positive integer.

In addition, in the layout mode in FIG. 3, the first electrode S8 of T8 may be coupled to the first voltage signal line VGH, and the second electrode D8 of T8 may be coupled to the second electrode plate C3b of the output capacitor C3, so the smaller the distance between T8 and each of VGH and C3, the more reasonable the layout. In a possible embodiment of the present disclosure, T8 may be arranged at a side of the first voltage signal line VGH away from the third voltage signal line VGL2, and arranged close to a previous stage of shift register unit, so as to make full use of a space between T8 of the $n^{th}$ stage of shift register unit and the first transistor of the $(n+1)^{th}$ stage of shift register unit, reduce a length of a signal line between a source electrode of T8 and VGH and reduce a length of a signal line between a drain electrode of T8 and C3, thereby to reduce the transverse width of the shift register unit. As shown in FIG. 3, T7, T6 and C1 may be arranged in the space between T8 of the $n^{th}$ stage of shift register unit and the first transistor of the $(n+1)^{th}$ stage of shift register unit, so as to make full use of the space.

Further, the gate electrode G5 of T5 may be coupled to be second electrode plate C1b of C1, and the second electrode D6 of T6 may be coupled to the first electrode plate C1a of the first capacitor C1, so T5 and T6 may be arranged close to VGH, and a shape of C1 may be adjusted through reducing a distance between T5 and T6. As shown in FIG. 3, each electrode plate of the first capacitor C1 may be of an L-like shape. In addition, as shown in FIG. 3, in order to make full use of an extra space between T2 of the $n^{th}$ stage of shift register unit and the second node control transistor of the $(n+1)^{th}$ stage of shift register unit, each electrode plate of the second capacitor C2 may be of an L-like shape. Through the above-mentioned arrangement, it is able to reduce the transverse width of the shift register unit to some extent, and optimize a longitudinal height.

In a possible embodiment of the present disclosure, the display substrate may include a scanning driving circuit arranged on the base substrate and including a plurality of shift register units. As shown in FIG. 3, the scanning driving circuit may further include a first voltage signal line VGH and a second voltage signal line VGL1.

As shown in FIGS. 2 and 3, the shift register unit may include an output transistor C3 and a first transistor T8.

Figure 6:
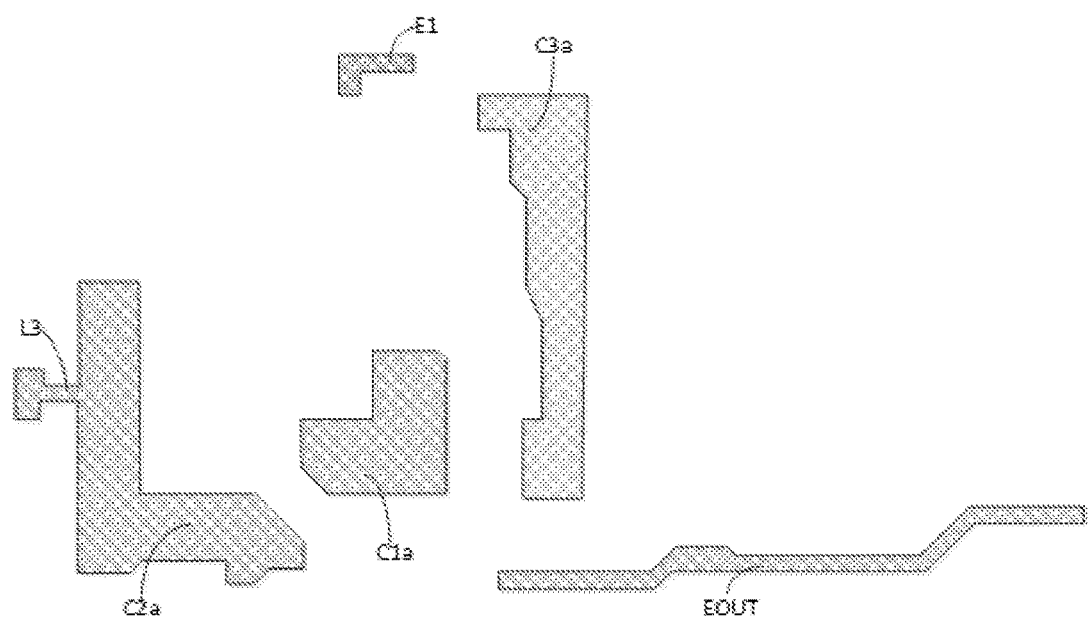
FIG. 6 is a schematic view showing a second gate metal layer in the shift register unit according to one embodiment of the present disclosure.
Figure 7:
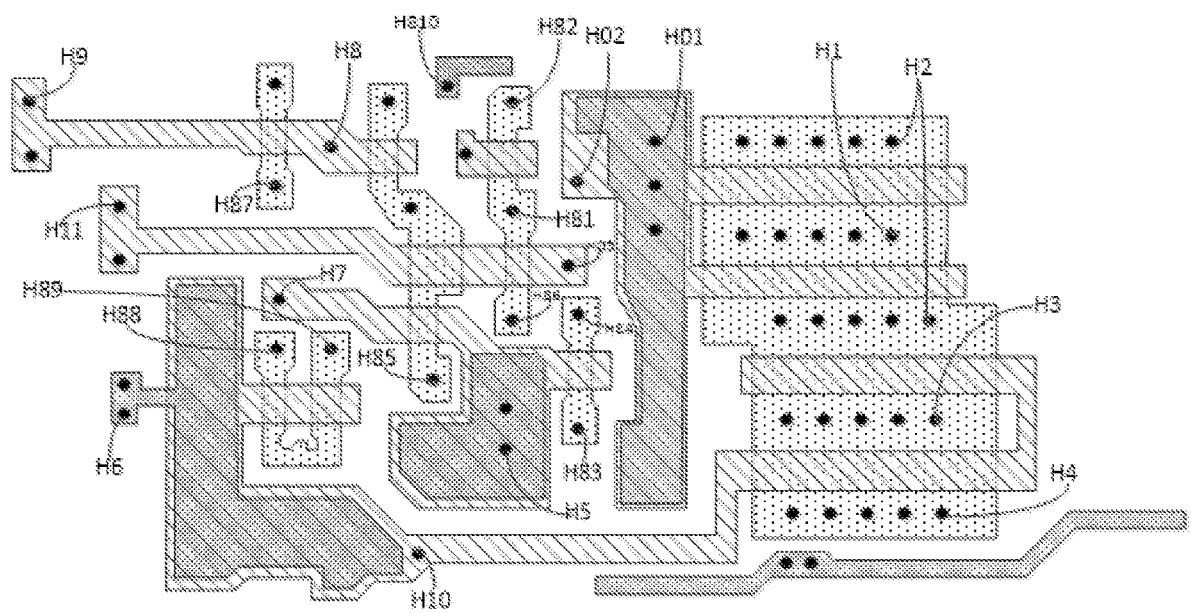
FIG. 7 is a schematic view showing via holes in the shift register unit according to one embodiment of the present disclosure.

As shown in FIGS. 3, 6 and 7, an orthogonal projection of a first electrode plate C3a of the output capacitor C3 onto the base substrate may overlap the orthogonal projection of the first voltage signal line VGH onto the base substrate at a signal line overlapping region, and the first electrode plate C3a of the output capacitor C3 may be coupled to the first voltage signal line VGH through at least one signal line via hole H01 in the signal line overlapping region. The first transistor T8 may be arranged between the first voltage signal line VGH and the second voltage signal line VGL1.

Figure 8:
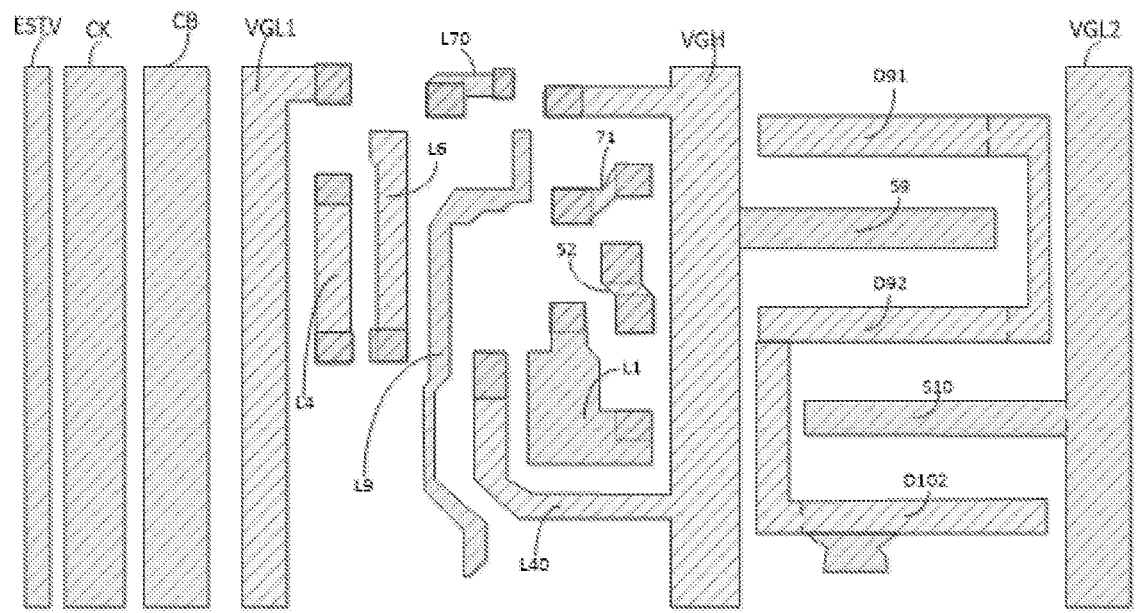
FIG. 8 is a schematic view showing a source-drain metal layer in the shift register unit according to one embodiment of the present disclosure.

As shown in FIG. 8, the at least one shift register unit may further include an electrode plate conductive connection member 71 coupled to a second electrode D8 of the first transistor T8.

As shown in FIGS. 3, 4, 7 and 8, the second electrode D8 of the first transistor T8 may be coupled to the electrode plate conductive connection member 81 through a first connection via hole H81.

As shown in FIGS. 3, 5, 7 and 8, an orthogonal projection of the electrode plate conductive connection member 71 onto the base substrate may overlap an orthogonal projection of a second electrode plate C3b of the output capacitor C3 onto the base substrate at an electrode plate overlapping region, and the electrode plate conductive connection member 71 may be coupled to the second electrode plate C3b of the output capacitor C3 through at least one electrode plate via hole H02 in the electrode plate overlapping region. A first electrode S8 of the first transistor T8 may be coupled to the first voltage signal line VGH.

During the implementation, as shown in FIG. 7, the first electrode S8 of the first transistor maybe coupled to the first voltage signal line VGH through a second connection via hole H82.

In the embodiments of the present disclosure, T8 may be arranged at a side of the first voltage signal line VGH away from the third voltage signal line VGL2, and the orthogonal projection of the electrode plate of the output capacitor C3 onto the base substrate may partially overlap the orthogonal projection of the first voltage signal line VGH onto the base substrate, so as to reduce a distance between the first electrode S8 of the first transistor T8 and the first voltage signal line VGH and reduce a distance between the second electrode D8 of the first transistor T8 and the second electrode plate C3b of the output capacitor C3, so that T8 may be coupled to the first voltage signal line VGH and the second electrode plate C3b of the output capacitor C3 conveniently, thereby to provide a compact space as well as a more reasonable layout.

In the embodiments of the present disclosure, a maximum distance between the orthogonal projection of the first electrode S8 of the first transistor T8 onto the base substrate and the orthogonal projection of the first voltage signal line VGH onto the base substrate may be smaller than a first predetermined distance in a second direction and a maximum distance between the orthogonal projection of the second electrode D8 of the first transistor T8 onto the base substrate and the orthogonal projection of the second electrode plate C3b of the output capacitor C3 onto the base substrate may be smaller than a second predetermined distance in the second direction, so it is able for the first transistor T8 to be arranged close to the first voltage signal line VGH and the output capacitor C3, thereby to reduce a transverse width of the shift register unit and provide a narrow bezel.

In a possible embodiment of the present disclosure, the first predetermined distance and the second predetermined distance may be set according to the practical need. For example, the first predetermined distance may be greater than or equal to 20 µm and smaller than or equal to 30 µm, and the second predetermined distance may be greater than or equal to 25 µm and smaller than or equal to 35 µm.

Figure 4:
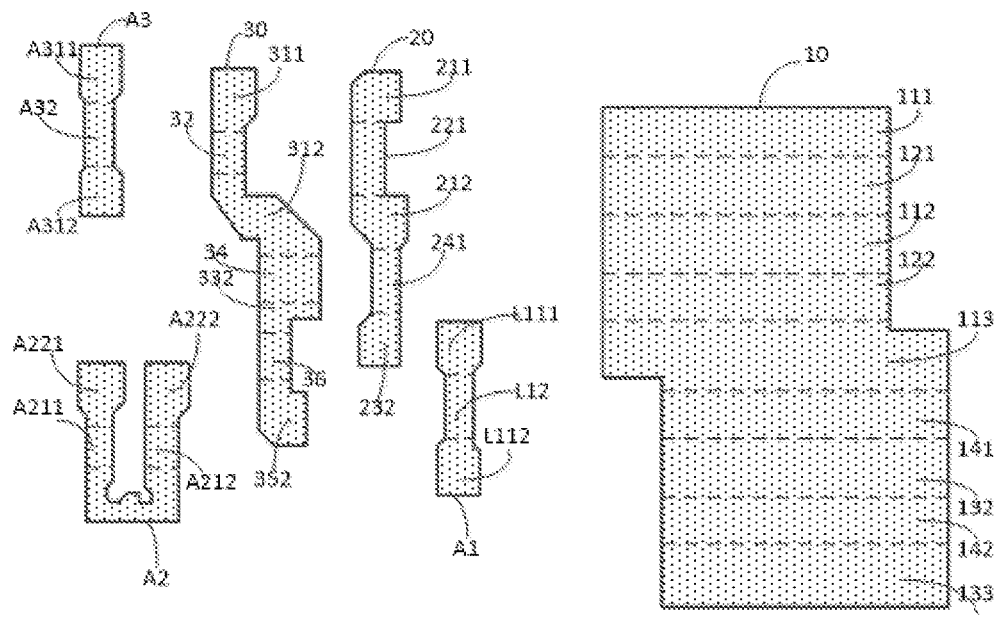
FIG. 4 is a schematic view showing an active layer in the shift register unit according to one embodiment of the present disclosure.

In a possible embodiment of the present disclosure, S8 and D8 may be arranged at an active layer. As shown in FIG. 4, the first one of the third conductive members 211 may serve as the first electrode S8 of the first transistor T8, and the second one of the third conductive members 212 may serve as the second electrode D8 of the first transistor T8.

In a possible embodiment of present disclosure, the maximum distance between the orthogonal projection of the first electrode S8 of the first transistor T8 onto the base substrate and the orthogonal projection of the first voltage signal line VGH onto the base substrate in the second direction may refer to a maximum distance between any point at an edge line of the orthogonal projection of the first electrode S8 of the first transistor T8 onto the base substrate and an edge line of the orthogonal projection of the first voltage signal line VGH onto the base substrate in the second direction. The maximum distance between the orthogonal projection of the second electrode D8 of the first transistor T8 onto the base substrate and the orthogonal projection of the second electrode plate C3b of the output capacitor C3 onto the base substrate in the second direction may refer to a maximum distance between any point at an edge line of the orthogonal projection of the second electrode D8 of the first transistor T8 onto the base substrate and an edge line of the orthogonal projection of the second electrode plate C3b of the output capacitor C3 onto the base substrate in the second direction.

Figure 10A:
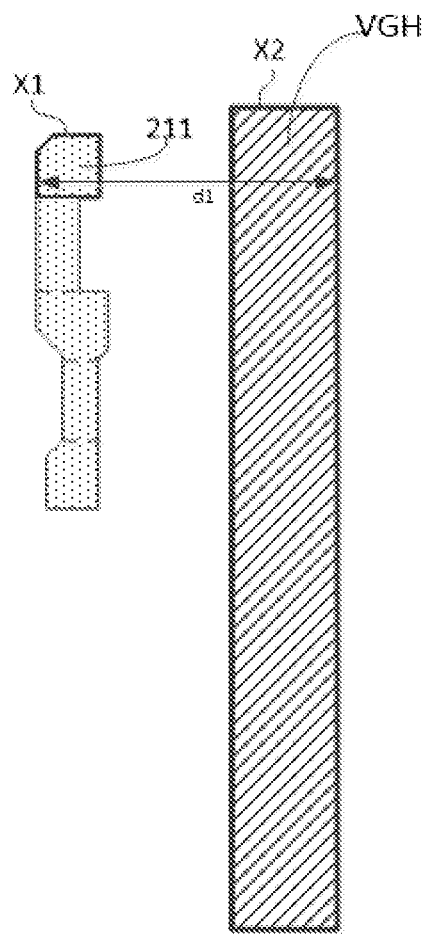
FIG. 10A is a schematic view showing a distance between an orthogonal projection of a first voltage signal line VGH onto a base substrate and an orthogonal projection of a first one of third conductive members 211 of a second semiconductor layer as a first electrode S8 of a first transistor T8 onto the base substrate according to one embodiment of the present disclosure.

FIG. 10A merely shows an orthogonal projection of the second semiconductor layer (including the first one of the third conductive members 211 and the second one of the third conductive members 212) in FIG. 4 onto the base substrate and the orthogonal projection of the first voltage signal line VGH onto the base substrate.

Figure 10B:
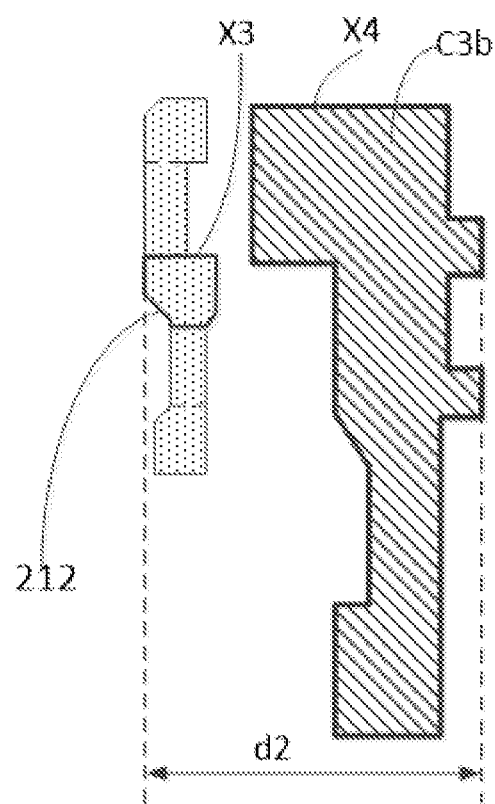
FIG. 10B is a schematic view showing a distance between the orthogonal projection of the first voltage signal line VGH onto a base substrate and an orthogonal projection of a second one of the third conductive members 211 of the second semiconductor layer as a second electrode D8 of the first transistor T8 onto the base substrate according to one embodiment of the present disclosure.

FIG. 10B merely shows the orthogonal projection of the second semiconductor layer (including the first one of the third conductive members 211 and the second one of the third conductive members 212) in FIG. 4 onto the base substrate and the orthogonal projection of the second electrode plate of the output capacitor C3 onto the base substrate.

In FIGS. 10A and 10B, X1 represents an edge line of the orthogonal projection of the first electrode S8 of the first transistor T8 onto the base substrate, X2 represents an edge line of the orthogonal projection of the first voltage signal line VGH onto the base substrate, X3 represents an edge line of the orthogonal projection of the second electrode D8 of the first transistor T8 onto the base substrate, and X4 represents an edge line of the orthogonal projection of the second electrode plate C3b of the output capacitor C3 onto the base substrate.

In FIG. 10A, d1 represents the maximum distance between the orthogonal projection of the first electrode S8 of the first transistor T8 onto the base substrate and the orthogonal projection of the first voltage signal line VGH onto the base substrate in the second direction.

In FIG. 10B, d2 represents the maximum distance between the orthogonal projection of the second electrode D8 of the first transistor T8 onto the base substrate and the orthogonal projection of the second electrode plate C3b of the output capacitor C3 onto the base substrate in the second direction.

During the implementation, the first voltage signal line VGH and the second voltage signal line VGL1 may, but not limited to, extend in the first direction.

In a possible embodiment of the present disclosure, as shown in FIG. 1, the at least one shift register unit may further include an input transistor T1.

As shown in FIG. 3, the first transistor T8 and the input transistor T1 may be arranged between the first voltage signal line VGH and the second voltage signal line VGL1, so that T8 may be directly arranged adjacent to T1 and the gate electrode of T8 may be coupled to a second electrode of T1 through a via hole and a wiring, rather than through a connection line over the voltage signal line.

As shown in FIGS. 3 and 4, a second one of fifth conductive members 312 may serve as a second electrode D1 of the input transistor T1.

As shown in FIGS. 3, 4 and 8, the second electrode D1 of the input transistor T1 may be coupled to a ninth conductive connection member L9, and a gate electrode G8 of the first transistor T8 may be coupled to the ninth conductive connection member L9, so that the gate electrode G8 of the first transistor T8 may be coupled to the second electrode D1 of the input transistor T1 conveniently through the ninth conductive connection member L9 and a via hole.

In a possible embodiment of the present disclosure, as shown in FIGS. 1 and 3, the at least one shift register unit may further include a third node control transistor T4 and an input transistor T1. T8, T1 and T4 may be arranged between the first voltage signal line VGH and the second voltage signal line VGL1.

As shown in FIG. 3, the second electrode D1 of the input transistor T1 may be reused as a second electrode of the third node control transistor T4. The second electrode D1 of the input transistor T1 may be coupled to the ninth conductive connection member L9, and the gate electrode G8 of the first transistor T8 may be coupled to the ninth conductive connection member L9, so that the gate electrode G8 of the first transistor T8 may be conveniently coupled to the second electrode of the third node control transistor T4 through the ninth conductive connection member L9 and a via hole, rather than through a connection line crossing over the voltage signal line.

As shown in FIGS. 1 and 3, the at least one shift register unit may further include a second capacitor C2, and C2 and T8 may be arranged at a side of the first voltage signal line VGH away from the display region.

As shown in FIGS. 3, 4, 6, 7 and 8, an orthogonal projection of a second electrode plate C2b of the second capacitor C2 onto the base substrate may overlap an orthogonal projection of the ninth conductive connection member L9 onto the base substrate at a tenth overlapping region, and the ninth conductive connection member L9 may be coupled to the second electrode plate C2b of the second capacitor through a tenth via hole H10 in the tenth overlapping region.

The gate electrode G8 of the first transistor T8 may be coupled to the ninth conductive connection member L9, so that the gate electrode G8 of the first transistor T8 may be coupled to the second electrode plate C2b of the second capacitor C2 conveniently through the ninth conductive connection member L9 and a via hole, rather than through a connection line crossing over the voltage signal line.

Figure 5:
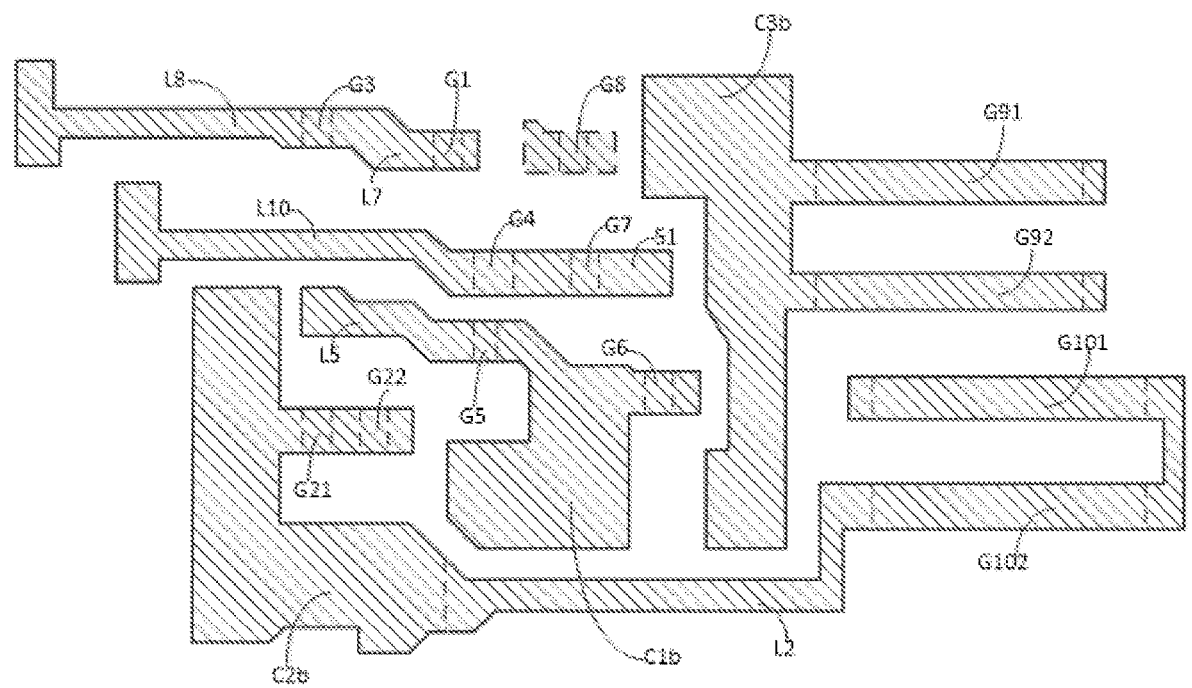
FIG. 5 is a schematic view showing a first gate metal layer in the shift register unit according to one embodiment of the present disclosure.

As shown in FIGS. 2, 3 and 5, the at least one shift register unit may include an output circuit which includes an output resetting transistor T9 and an output transistor T10. A first output resetting gate electrode pattern G91 and a second output resetting gate electrode pattern G92 of a gate electrode G9 of the output resetting transistor T9 may be coupled to the second electrode plate C3b of the output capacitor C3.

As shown in FIGS. 3 and 6, the orthogonal projection of the first electrode plate C3a of the output capacitor C3 onto the base substrate may at least partially overlap the orthogonal projection of the second electrode plate C3b of the output capacitor C3 onto the base substrate.

During the implementation, the display substrate may further include a second voltage signal line arranged at a side of the first transistor away from the first voltage signal line and extending in the first direction.

In the embodiments of the present disclosure, the second voltage signal line may be a low voltage signal line, and a low voltage provided by the second voltage signal line may, but not limited to, be the same as a low voltage provided by the first voltage signal line.

To be specific, the first transistor may be arranged between the first voltage signal line and the second voltage signal line.

In a possible embodiment of the present disclosure, as shown in FIG. 3, the shift register unit may further include a second transistor T7.

As shown in FIG. 4, an active layer of the first transistor T8 and an active layer of the second transistor T7 may be formed by a continuous second semiconductor layer 20 extending in the first direction. The active layer of the first transistor T8 may include a first one of third conductive members 211, a third channel member 221 and a second one of the third conductive members 212 arranged sequentially in the first direction, and the second one of the third conductive members 212 may be reused as a first one of fourth conductive members. The active layer of the second transistor T7 may include the first one of the fourth conductive members, a fourth channel member 241 and a second one of the fourth conductive members 232 arranged sequentially in the first direction. As shown in FIGS. 3 and 8, the second electrode D8 of the first transistor T8 may be reused as a first electrode S7 of the second transistor T7.

In a possible embodiment of the present disclosure, the first one of the third conductive members 211 may serve as the first electrode S8 of the first transistor T8, the second one of the third conductive members 212 may serve as the second electrode D8 of the first transistor T8, and the second one of the fourth conductive members 232 may serve as the second electrode D7 of the second transistor T7.

In a possible embodiment of the present disclosure, T7 may be arranged between T8 and C1, and the second electrode S8 of T8 may be reused as the second electrode of T7, so as to reduce the longitudinal height of the shift register unit while reducing the transverse width of the shift register unit.

As shown in FIG. 3, in a possible embodiment of the present disclosure, the display substrate may include a base substrate, and a scanning driving circuit arranged on the base substrate and including a plurality of shift register units. The scanning driving circuit may further include a first voltage signal line VGH and a third voltage signal line VGL2. At least one of the plurality of shift register units may include an output circuit O1 coupled to the first voltage signal line VGH and the third voltage signal line VGL2. A transistor in the output circuit O1 may be arranged between the first voltage signal line VGH and the third voltage signal line VGL2.

During the implementation, the first voltage signal line VGH and the third voltage signal line VGL2 may extend in a first direction.

In the embodiments of the present disclosure, the output circuit O1 may be arranged between the first voltage signal line VGH and the third voltage signal line VGL2. In this regard, in a spatial structure, the first voltage signal line VGH may be arranged at a side of the output circuit O1 away from the display region, and no signal line or member of the other transistor may be arranged between the first voltage signal line VGH and the output circuit O1. The third voltage signal line VGL2 may be arranged at a side of the output circuit O1 adjacent to the display region, and no signal line or member of the other transistor may be arranged between the third voltage signal line VGL2 and the output circuit O1. As a result, it is able to reduce a distance between the first voltage signal line VGH and the output circuit O1 and a distance between the third voltage signal line VGL2 and the output circuit O1, thereby to reduce the transverse width of the shift register unit.

During the implementation, the first transistor T8 may be arranged at a side of the first voltage signal line VGH away from the transistor of the output circuit O1.

During the implementation, the first voltage signal line VGH may be arranged at a side of the third voltage signal line VGL2 away from the display region.

To be specific, the output circuit may include an output transistor and an output resetting transistor arranged in the first direction. A first electrode of the output resetting transistor may be coupled to the first voltage signal line, and a first electrode of the output transistor maybe coupled to the third voltage signal line.

As shown in FIG. 3, the output circuit O1 may include an output resetting transistor T9 and an output transistor T10 arranged sequentially from top to bottom. A first electrode S9 of the output resetting transistor T9 may be coupled to the first voltage signal line VGH, and a first electrode S10 of the output transistor T10 may be coupled to the third voltage signal line VGL2.

In a possible embodiment of the present disclosure, the at least one shift register unit may further include a signal output line coupled to a second electrode of the output transistor and a second electrode of the output resetting transistor. The signal output line may extend in a second direction intersecting the first direction.

During the implementation, the at least one shift register unit may further include the signal output line, and the output transistor and the output resetting transistor may be coupled to the signal output line, so the output transistor and the output resetting transistor shall be arranged close to the signal output line. In the embodiments of the present disclosure, the signal output line may be moved downward to be between the output circuits of the adjacent shift register units, so as to reduce the transverse width of the shift register unit.

In the embodiments of the present disclosure, the output resetting transistor T9 is configured to provide an invalid light emitting control signal, and the output transistor T10 is configured to provide a valid light emitting control signal.

In the embodiments of the present disclosure, the valid light emitting control signal may be a voltage signal capable of enabling light emitting control transistor (a gate electrode of which is coupled to the light emitting control line) in a pixel circuit to be turned on, and the invalid light emitting control signal may be a voltage signal capable of enabling the light emitting control transistor to be turned off.

To be specific, a plurality of subpixels may be arranged at the display region of the display substrate, and at least one of the plurality of subpixels may include a pixel driving circuit. The pixel driving circuit may include transistors, gate lines, light emitting control lines and data lines. The plurality of shift register units of the scanning driving circuit may correspond to the plurality of light emitting control lines in a one-to-one manner. The signal output line of each shift register unit may be coupled to a corresponding light emitting control line, and configured to provide the light emitting control signal to the corresponding light emitting control line.

In a possible embodiment of the present disclosure, an active layer of the output transistor and an active layer of the output resetting transistor may be formed by a continuous first semiconductor layer, and the first semiconductor layer and the output signal line may be arranged in the first direction.

During the implementation, the active layer of the output transistor and the active layer of the output resetting transistor may be formed by, but not limited to, a continuous first semiconductor layer.

In a possible embodiment of the present disclosure, an active layer of the output transistor and an active layer of the output resetting transistor may be formed by a continuous first semiconductor layer. The active layer of the output resetting transistor may include at least one first conductive member and at least one first channel member arranged opposite to each other in the first direction, and each first channel member may be arranged between two adjacent first conductive members. The active layer of the output transistor may include at least two second conductive members and at least one second channel member arranged opposite to the second conductive members in the first direction, and each second channel member may be arranged between two adjacent second conductive members. A first conductive member in the active layer of the output resetting transistor closest to the active layer of the output transistor may be reused as a second conductive member of the output transistor, so as to further reduce a layout space of the output transistor and the output resetting transistor, thereby to provide the display substrate with a narrow bezel.

As shown in FIG. 4, the active layer of the output resetting transistor T9 and the active layer of the output transistor T10 may be formed by a continuous first semiconductor layer 10 extending in the first direction. The active layer of the output resetting transistor T9 may include a first one of first conductive members 111, a second one of the first conductive members 112 and a third one of the first conductive members 113 arranged opposite to each other in the first direction. It may further include a first one of first channel members 121 and a second one of the first channel members 122. The first one of the first channel members 121 may be arranged between the first one of the first conductive members 111 and the second one of the first conductive members 112, and the second one of the first channel members 122 may be arranged between the second one of the first conductive members 112 and the third one of the first conductive members 113. The first conductive member 113 may be reused as a first one of second conductive members in the active layer of the output transistor T10.

The active layer of the output transistor T10 may include a second one of second conductive members 132 and a third one of the second conductive members 133. It may further include a first one of second channel members 141 and a second one of the second channel members 142. The first one of the second channel members 141 may be arranged between the first one of the second conductive members and the second one of the second conductive members 132, and the second one of the second channel members 142 may be arranged between the second one of the second conductive members 132 and the third one of the second conductive members 133.

For each of the output resetting transistor T9 and the output transistor T10, the conductive members at both sides of the channel member may serve as the first electrode and the second electrode of the transistor respectively, or may be coupled to the first electrode and the second electrode of the transistor respectively, so that T9 and T10 may be electrically connected to each other directly through the third one of the first conductive members 113.

During the manufacture of the first semiconductor layer 11, for example, a first semiconductor material layer may be formed at first, and then the gate electrode G9 of the output resetting transistor T9 and the gate electrode G10 of the output transistor T10 may be formed. Then, a portion of the first semiconductor material layer not covered by the gate electrodes of the transistors may be doped with the gate electrode G9 of the output resetting transistor T9 and the gate electrode G10 of the output transistor T10 as a mask, so that the portion of the first semiconductor material layer not covered by the gate electrodes of the transistors forms the conductive members, and a portion of the first semiconductor material layer covered by the gate electrodes of the transistors forms the channel members.

Based on the above structure of the display substrate, in the embodiments of the present disclosure, the output resetting transistor T9 and the output transistor T10 in the shift register unit may be arranged in the first direction, so as to reduce an area occupied by the shift register unit in the second direction, thereby to provide the display substrate with a narrow bezel.

To be specific, the gate electrode of the output resetting transistor may include at least one output resetting gate electrode pattern, the first electrode of the output resetting transistor may include at least one first electrode pattern, and the second electrode of the output resetting transistor may include at least one second electrode pattern. The output resetting gate electrode pattern may be arranged between the first electrode pattern and the second electrode pattern adjacent to each other. The second electrode pattern, the output resetting gate electrode pattern and the first electrode pattern may extend in the second direction intersecting the first direction.

To be specific, the gate electrode of the output transistor may include at least one output gate electrode pattern, the first electrode of the output transistor may include at least one third electrode pattern, and the second electrode of the output transistor may include at least one fourth electrode pattern. The output gate electrode pattern may be arranged between the third electrode pattern and the fourth electrode pattern adjacent to each other. The fourth electrode pattern, the output gate electrode pattern and the third electrode pattern may extend in the second direction intersecting the first direction. The second electrode pattern of the output resetting transistor closest to the gate electrode of the output transistor may be reused as the fourth electrode pattern of the output transistor.

During the implementation, the quantity of the output resetting gate electrode patterns, the quantity of the first electrode patterns, the quantity of the second electrode patterns, the quantity of the output gate electrode patterns, the quantity of the third electrode patterns and the quantity of fourth electrode patterns may be set according to the practical need. For example, as shown in FIGS. 5 and 8, the quantity of the output gate electrode patterns and the quantity of the output resetting gate electrode patterns may be two, the quantity of the first electrode patterns and the quantity of the third electrode patterns may be one, and the quantity of the second electrode patterns and the quantity of the fourth electrode patterns may be two.

In addition, because the second electrodes of the output transistor and the output resetting transistor are coupled to the signal output line, during the arrangement of the output transistor and the output resetting transistor, the second electrode pattern of the output resetting transistor closest to the gate electrode of the output transistor may be reused as the fourth electrode pattern of the output transistor, so as to further reduce a layout space of each of the output transistor and the output resetting transistor, thereby to provide the display substrate with a narrow bezel.

As shown in FIGS. 3 and 5, in some embodiments of the present disclosure, the gate electrode G9 of the output resetting transistor T9 may include a first output resetting gate electrode pattern G91 and a second output resetting gate electrode pattern G92, and the gate electrode G10 of the output transistor T10 may include a first output gate electrode pattern G101 and a second output gate electrode pattern G102. The first output resetting gate electrode pattern G91, the second output resetting gate electrode pattern G92, the first output gate electrode pattern G101 and the second output gate electrode pattern G102 may be arranged sequentially in the first direction, and extend in the second direction intersecting the first direction. The first output resetting gate electrode pattern G91 may be coupled to the second output resetting gate electrode pattern G92, and the first output gate electrode pattern G101 may be coupled to the second output gate electrode pattern G102.

As shown in FIG. 8, the second electrode D9 of the output resetting transistor T9 may include a first one of second electrode pattern D91 and a second one of the second electrode patterns D92. D91, S9 and D92 may be arranged sequentially in the first direction and extend in the second direction, and S9 may be coupled to the first voltage signal line VGH. D92 may be reused as a first one of fourth electrode patterns in the second electrode D10 of the output transistor T10. The second electrode D10 of the output transistor T10 may further include a second one of the fourth electrode patterns D102. D92, S10 and D102 may be arranged sequentially in the first direction, and S10 may be coupled to the third voltage signal line VGL2.

As shown in FIGS. 3, 5 and 8, an orthogonal projection of G91 onto the base substrate may be arranged between an orthogonal projection of D91 onto the base substrate and an orthogonal projection of S9 onto the base substrate, an orthogonal projection of G92 onto the base substrate may be arranged between the orthogonal projection of S9 onto the base substrate and an orthogonal projection of D92 onto the base substrate, an orthogonal projection of G101 onto the base substrate may be arranged between the orthogonal projection of D92 onto the base substrate and an orthogonal projection of S10 onto the base substrate, and an orthogonal projection of G102 onto the base substrate may be arranged between the orthogonal projection of S10 onto the base substrate and an orthogonal projection of D102 onto the base substrate.

In the embodiments of the present disclosure, during the operation of the shift register unit in the scanning driving circuit, when T10 is turned on, the shift register unit may continuously output a low voltage signal. In order to maintain a stable voltage signal applied to the gate electrode of T10, it is necessary to prevent the gate electrode G10 of T10 from overlapping the clock signal line. At this time, G10 may overlap the second voltage signal line VGL1 (a direct-current voltage signal line), so as to minimize the influence on the voltage signal applied to the gate electrode G10 of T10.

During the implementation, the active layer of the output resetting transistor may include at least two first conductive members arranged opposite to each other in the first direction, and at least one first channel member. Each first channel member may be arranged between two adjacent first conductive members. The first channel members may correspond to the output resetting gate electrode patterns in a one-to-one manner, and an orthogonal projection of each first channel member onto the base substrate may be located within the orthogonal projection of the corresponding output resetting gate electrode pattern onto the base substrate. A part of the first conductive members of the output resetting transistor may correspond to the first electrode patterns in a one-to-one manner, an orthogonal projection of each first electrode pattern onto the base substrate may overlap an orthogonal projection of the corresponding first conductive member onto the base substrate at a first overlapping region, and the first electrode pattern may be coupled to the corresponding first conductive member through at least one first via hole in the first overlapping region. Another part of the first conductive members of the output resetting transistor may correspond to the second electrode patterns in a one-to-one manner, an orthogonal projection of each second electrode pattern onto the base substrate may overlap an orthogonal projection of the corresponding first conductive member onto the base substrate at a second overlapping region, and the second electrode pattern may be coupled to the corresponding first conductive member through at least one second via hole in the second overlapping region.

During the implementation, the active layer of the output transistor may include at least two second conductive members arranged opposite to each other in the first direction, and at least one second channel member. Each second channel member may be arranged between two adjacent second conductive members. The second channel members may correspond to the output gate electrode patterns in a one-to-one manner, and an orthogonal projection of each second channel member onto the base substrate may be located within the orthogonal projection of the corresponding output gate electrode pattern onto the base substrate. Apart of the second conductive members of the output transistor may correspond to the third electrode patterns in a one-to-one manner, an orthogonal projection of each third electrode pattern onto the base substrate may overlap an orthogonal projection of the corresponding second conductive member onto the base substrate at a third overlapping region, and the third electrode pattern may be coupled to the corresponding second conductive member through at least one third via hole in the third overlapping region. Another part of the first conductive members of the output transistor may correspond to the fourth electrode patterns in a one-to-one manner, an orthogonal projection of each fourth electrode pattern onto the base substrate may overlap an orthogonal projection of the corresponding second conductive member onto the base substrate at a fourth overlapping region, and the fourth electrode pattern may be coupled to the corresponding second conductive member through at least one fourth via hole in the fourth overlapping region.

As shown in FIGS. 4, 5, 7 and 8, a first one of the first channel members 121 may correspond to the first output resetting gate electrode pattern G91, and a second one of the first channel members 122 may correspond to the second output resetting gate electrode pattern G92. An orthogonal projection of the first one of the first channel members 121 onto the base substrate may be located within the orthogonal projection of G91 onto the base substrate, and an orthogonal projection of the second one of the first channel members 122 onto the base substrate may be located within the orthogonal projection of G92 onto the base substrate. A first one of the first conductive members 111 may correspond to the first one of the second electrode patterns D91, a second one of the first conductive members 112 may correspond to the first electrode S9 of the output resetting transistor, and a third one of the first conductive members 113 may correspond to the second one of the second electrode patterns D92. The orthogonal projection of S9 onto the base substrate may overlap an orthogonal projection of the second one of the first conductive members 112 onto the base substrate at a first overlapping region, and S9 may be coupled to the second one of the first conductive members 112 through at least one first via hole H1 in the first overlapping region. The orthogonal projection of D91 onto the base substrate may overlap an orthogonal projection of the first one of the first conductive members 111 onto the base substrate at a first one of second overlapping regions, and D91 may be coupled to the first one of the first conductive members 111 through at least one second via hole H2 in the first one of the second overlapping regions. The orthogonal projection of D92 onto the base substrate may overlap an orthogonal projection of the third one of the first conductive members 113 onto the base substrate at a second one of the second overlapping regions, and D92 may be coupled to the third one of the first conductive members 113 through at least one second via hole H2 in the second one of the second overlapping regions. The first one of the second channel members 141 may correspond to the first output gate electrode pattern G101, and the second one of the second channel members 142 may correspond to the second output gate electrode pattern G102. An orthogonal projection of the first one of the second channel members 141 onto the base substrate may be located within the orthogonal projection of G101 onto the base substrate, and an orthogonal projection of the second one of the second channel members 142 onto the base substrate may be located within the orthogonal projection of G102 onto the base substrate. D92 may be reused as the first one of the fourth electrode patterns, and the third one of the first conductive members 113 may be reused as the first one of the second conductive members corresponding to the first one of the fourth electrode pattern. The second one of the second conductive members 132 may correspond to the first electrode S10 of the output transistor, and the third one of the second conductive members 133 may correspond to the second one of the fourth electrode patterns D102. The orthogonal projection of S10 onto the base substrate may overlap an orthogonal projection of the second one of the second conductive members 132 onto the base substrate at a third overlapping region, and S10 may be coupled to the second one of the second conductive members 132 through at least one third via hole H3 in the third overlapping region. The orthogonal projection of D102 onto the base substrate may overlap an orthogonal projection of the third one of the second conductive members 133 onto the base substrate at a fourth overlapping region, and D102 may be coupled to the third one of the second conductive members 133 through the at least one fourth via hole H4 in the fourth overlapping region.

In the embodiments of the present disclosure, the quantity of the first via holes, the quantity of the second via holes, the quantity of the third via holes, and the quantity of the fourth via holes may be set according to the practical need.

According to the display substrate in the embodiments of the present disclosure, the active layers of the output resetting transistor T9 and the output transistor T10 may be formed through the first semiconductor layer 10 extending in the first direction, so that T9 and T10 may each occupy a small space in the second direction. In addition, through increasing a size of each of the active layers of the output resetting transistor T9 and the output transistor T10 in the first direction, it is able to ensure a channel width of each of T9 and T10, thereby to reduce a bezel width of the display substrate while ensuring the operation performance of T9 and T10.

As shown in FIGS. 3, 4 and 6, an orthogonal projection of the signal output line EOUT onto the base substrate may be arranged between an orthogonal projection of the first semiconductor layer 10 in the $n^{th}$ stage of shift register unit onto the base substrate and an orthogonal projection of the first semiconductor layer in the $(n+1)^{th}$ stage of shift register unit onto the base substrate, and the first semiconductor layer 10 and the signal output line EOUT may be arranged in the first direction, so as to reduce the transverse width of the shift register unit.

In the embodiments of the present disclosure, FIG. 4 shows the active layer in FIG. 3, FIG. 5 shows a first gate metal layer in FIG. 3, FIG. 6 shows a second gate metal layer in FIG. 3, FIG. 7 shows the via holes formed after the formation of the active layer, the first gate metal layer and the second gate metal layer, and FIG. 8 shows a source-drain metal layer in FIG. 3.

During the implementation, the active layer, the first gate metal layer, the second gate metal layer, the via holes and the source-drain metal layer may be arranged sequentially on the base substrate, so as to form the display substrate.

In a possible embodiment of the present disclosure, apart from the output transistor and the output resetting transistor, the shift register unit may further include a plurality of transistors. Conductive members at both sides of a channel member of each transistor may serve as a first electrode and a second electrode of the transistor respectively, or may be coupled to the first electrode and the second electrode of the transistor respectively.

In a possible embodiment of the present disclosure, the at least one shift register unit may further include a first capacitor, and a transistor coupled to a second electrode plate of the first capacitor. The first capacitor and the transistor coupled to the second electrode plate of the first capacitor may be arranged at a side of the first voltage signal line away from the third voltage signal line. A maximum distance between an orthogonal projection of a gate electrode of the transistor coupled to the second electrode plate of the first capacitor onto the base substrate and the orthogonal projection of the first voltage signal line onto the base substrate in the second direction may be smaller than a third predetermined distance.

During the implementation, the transistor coupled to the second electrode plate of the first capacitor may also be coupled to the first voltage signal line, so the transistor coupled to the second electrode plate of the first capacitor should be better arranged close to the first voltage signal line. In the embodiments of the present disclosure, when the maximum distance between the orthogonal projection of the gate electrode of the transistor coupled to the second electrode plate of the first capacitor onto the base substrate and the orthogonal projection of the first voltage signal line onto the base substrate in the second direction is smaller than a third predetermined distance, it is able to reduce the transverse width of the shift register unit.

In a possible embodiment of the present disclosure, the third predetermined distance may be set according to the practical need, e.g., it may be greater than or equal to 30 μm and smaller than or equal to 40 μm.

In the embodiments of the present disclosure, the maximum distance between the orthogonal projection of the gate electrode of the transistor coupled to the second electrode plate of the first capacitor onto the base substrate and the orthogonal projection of the first voltage signal line onto the base substrate in the second direction may refer to a maximum distance between any point on an edge line of the orthogonal projection of the gate electrode of the transistor coupled to the second electrode plate of the first capacitor onto the base substrate and an edge line of the orthogonal projection of the first voltage signal line onto the base substrate in the second direction.

To be specific, as shown in FIGS. 1 and 3, the transistor coupled to the second electrode plate C1b of the first capacitor C1 may include a first capacitor connection transistor T6 and a second capacitor connection transistor T5.

As shown in FIGS. 3 and 5, a gate electrode G6 of the first capacitor connection transistor T6 and a gate electrode G5 of the second capacitor connection transistor T5 may be coupled to the second electrode plate C1b of the first capacitor C1.

As shown in FIGS. 3, 7 and 8, the at least one shift register unit may further include a first conductive connection member L1 coupled to a second electrode D6 of the first capacitor connection transistor T6, an orthogonal projection of the first conductive connection member L1 onto the base substrate may overlap an orthogonal projection of the first electrode plate C1a of the first capacitor C1 onto the base substrate at a fifth overlapping region, and the first conductive connection member L1 may be coupled to the first electrode plate C1a of the first capacitor C1 through at least one fifth via hole H5 in the fifth overlapping region.

In a possible embodiment of the present disclosure, the second electrode D6 of the first capacitor connection transistor T6 may be coupled to the first conductive connection member L1 through a third connection via hole H83.

In a possible embodiment of the present disclosure, the first conductive connection member L1 may be of, but limited to, an L-like shape.

Figure 10C:
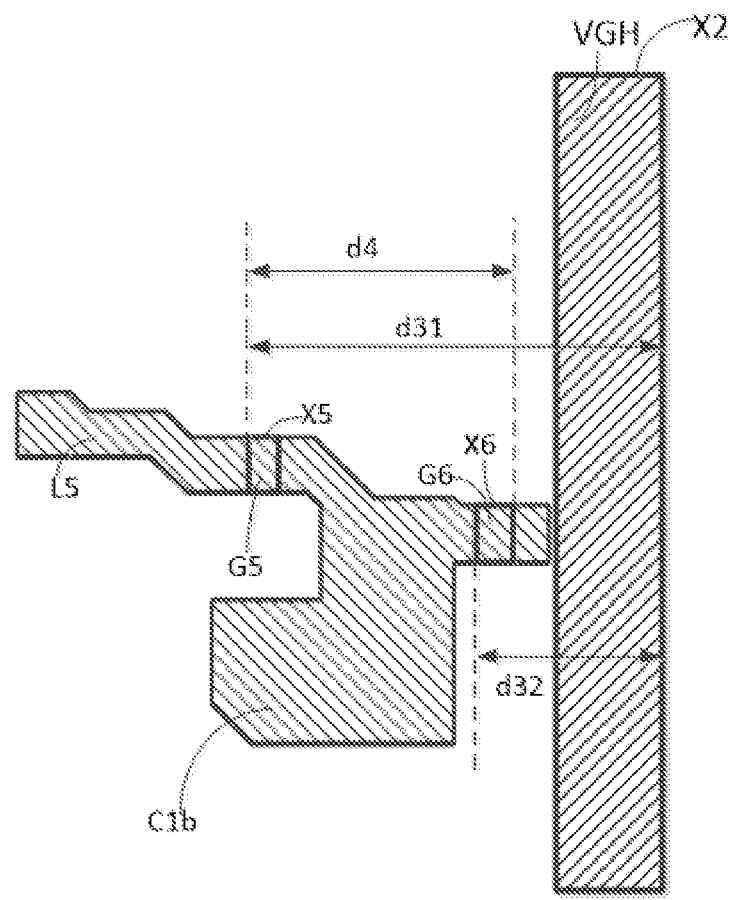
FIG. 10C is a schematic view showing distances between any two of an orthogonal projection of a gate electrode G5 of T5 onto the base substrate, an orthogonal projection of a gate electrode G6 of T6 onto the base substrate and the orthogonal projection of the first voltage signal line VGH onto the base substrate according to one embodiment of the present disclosure.

FIG. 10C merely shows the orthogonal projections of the gate electrode G5 of T5, the gate electrode G6 of T6, the second electrode plate C1b of C1, the fifth conductive connection member L5 and the first voltage signal line VGH onto the base substrate.

In FIG. 10C, X2 represents an edge line of the orthogonal projection of the first voltage signal line VGH onto the base substrate, X5 represents an edge line of the orthogonal projection of G5 onto the base substrate, and X6 represents an edge line of the orthogonal projection of G5 onto the base substrate.

In FIG. 10C, d3 represents a maximum distance between the orthogonal projection of the gate electrode G5 of T5 onto the base substrate and the orthogonal projection of VGH onto the base substrate in the second direction, and d4 represents a maximum distance between the orthogonal projection of the gate electrode G6 of T6 onto the base substrate and the orthogonal projection of VGH onto the base substrate in the second direction.

In a possible embodiment of the present disclosure, as shown in FIGS. 1 and 3, the shift register unit may further include a second transistor T7.

As shown in FIGS. 3, 5, 7 and 8, the at least one shift register unit may further include a gate electrode connection conductive member 51 coupled to a gate electrode G7 of the second transistor T7, and a first electrode connection conductive member 52 coupled to the first electrode S6 of the first capacitor connection transistor T6. The gate electrode connection conductive member 51 may overlap the first electrode connection conductive member 52 at a connection overlapping region. The gate electrode connection conductive member 51 may be coupled to the first electrode connection conductive member 52 through an electrode connection via hole H05 in the connection overlapping region, so that the gate electrode G7 of the second transistor T7 may be coupled to the first electrode S6 of the first capacitor connection transistor T6.

In a possible embodiment of the present disclosure, the first electrode S6 of the first capacitor connection transistor T6 may be coupled to the first electrode connection conductive member 52 through a fourth connection via hole H84, and a second electrode D7 of the second transistor T7 may be coupled to the first conductive connection member L1.

To be specific, as shown in FIG. 3, the first electrode S5 of the second capacitor connection transistor T5 may be coupled to the first voltage signal line VGH.

As shown in FIGS. 3 and 10C, a maximum distance d32 between the orthogonal projection of the gate electrode G6 of the first capacitor connection transistor T6 onto the base substrate and the orthogonal projection of the first voltage signal line VGH onto the base substrate in the second direction may be smaller than a maximum distance d31 between the orthogonal projection of the gate electrode of the second capacitor connection transistor T5 onto the base substrate and the orthogonal projection of the first voltage signal line VGH onto the base substrate in the second direction, i.e., T5 may be arranged at a side of T6 away from the first voltage signal line VGH.

In a possible embodiment of the present disclosure, as shown in FIGS. 3, 4, 7 and 8, the first electrode S5 of the second capacitor connection transistor T5 may be coupled to a signal line conductive connection member L40 through a fifth connection via hole H85, and the signal line conductive connection member L40 may be coupled to the first voltage signal line VGH, so that the first electrode S5 of the second capacitor connection transistor T5 may be coupled to the first voltage signal line VGH.

In a possible embodiment of the present disclosure, the signal line conductive connection member L40 may be of an L-like shape.

In a possible embodiment of the present disclosure, as shown in FIG. 5, a maximum distance between the gate electrode G6 of the first capacitor connection transistor T6 and the gate electrode G5 of the second capacitor connection transistor T5 in the second direction may be smaller than a fourth predetermined distance.

As shown in FIG. 3, the orthogonal projection of the first electrode plate C1a of the first capacitor C1 onto the base substrate may be located within the orthogonal projection of the second electrode plate C1b of the first capacitor C1 onto the base substrate.

As shown in FIG. 6, the first electrode plate C1a of the first capacitor C1 may be of an L-like shape.

In the embodiments of the present disclosure, T5 may be arranged close to T6, so as to adjust a shape of the electrode plate of C1. When the first electrode plate C1a of C1 is of an L-like shape, it is able to make full use of a wiring space between the gate electrode of T5 and the second conductive connection member, and provide a more reasonable layout, thereby to effectively reduce the transverse width of the shift register unit as well as the longitudinal height of the shift register unit.

In a possible embodiment of the present disclosure, the fourth predetermined distance may be set according to the practical need, e.g., it may be greater than or equal to 20 µm and smaller than or equal to 30 µm.

In a possible embodiment of the present disclosure, the fourth predetermined distance may be, but not limited to, 18 µm.

In the embodiments of the present disclosure, the maximum distance between the gate electrode G6 of the first capacitor connection transistor T6 and the gate electrode G5 of the second capacitor connection transistor T5 in the second direction may refer to a maximum distance between any point on an edge line of G5 and an edge line of G6 in the second direction. In FIG. 10C, d4 represents the maximum distance between any point on the edge line of G5 and the edge line of G6 in the second direction.

During the implementation, as shown in FIG. 1, the shift register unit may include a first transistor T8 and a second transistor T7.

Figure 9:
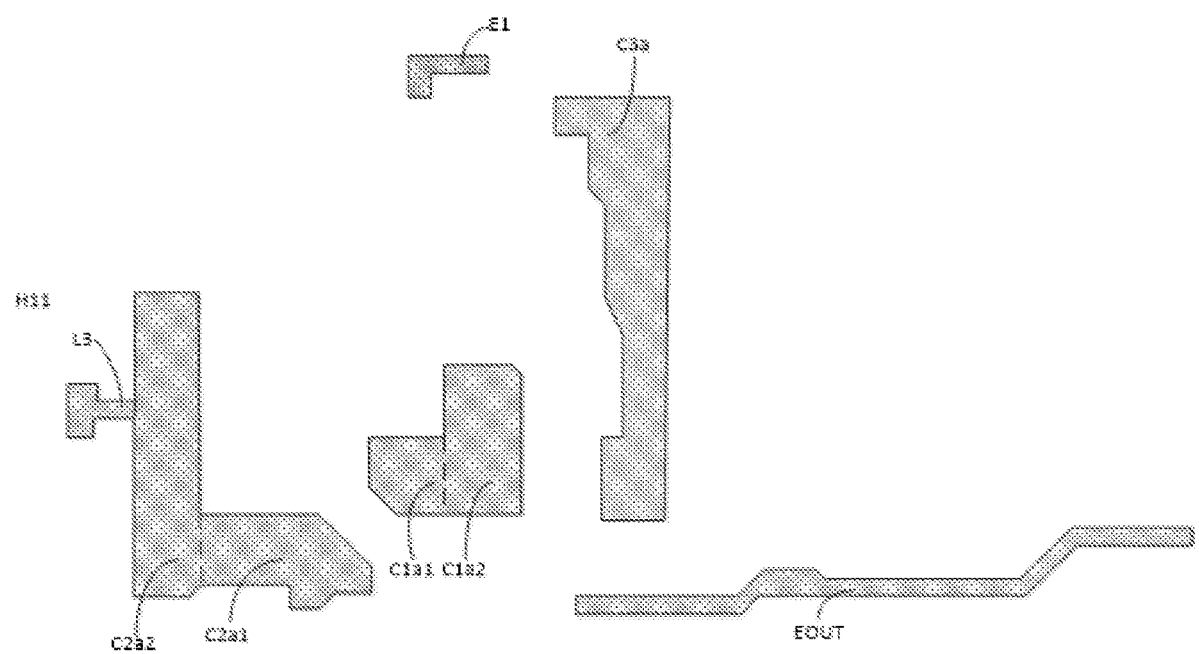
FIG. 9 is a schematic view showing the division of electrode plates of a capacitor on the basis of FIG. 6.

As shown in FIG. 9, on the basis of FIG. 6, the first electrode plate C1a of the first capacitor C1 may include a first horizontal electrode plate member C1a1 and a first vertical electrode plate member C1a2.

As shown in FIGS. 3 and 9, the orthogonal projection of the gate electrode G5 of the second capacitor connection transistor T5 onto the base substrate and an orthogonal projection of the first horizontal electrode plate member C1a1 onto eh base substrate may be arranged in the first direction. An orthogonal projection of a gate electrode G8 of the first transistor T8 onto the base substrate, an orthogonal projection of a gate electrode G7 of the second transistor T7 onto the base substrate and an orthogonal projection of the first vertical electrode plate member C1a2 onto the base substrate may be arranged in the first direction. The orthogonal projection of the first vertical electrode plate member C1a2 onto the base substrate may be arranged between the orthogonal projection of the second electrode D6 of the first capacitor connection transistor T6 onto the base substrate and the orthogonal projection of the first electrode S5 of the second capacitor connection transistor T5 onto the base substrate. A first electrode S7 of the second transistor T7 may be coupled to the second electrode plate C3b of the output capacitor C3.

In the embodiments of the present disclosure, C1 may be arranged through making full use of a space between T5 and T6 as well as a space between the gate electrode of T5 and the second conductive connection member, and each electrode plate of C1 may be of an L-like shape, so as to provide a reasonable layout.

In a possible embodiment of the present disclosure, a second electrode D7 of the second transistor T7 may be coupled to the first conductive connection member L1 through a sixth connection via hole H86, so that the second electrode D7 of the second transistor T7 may be coupled to the second electrode D6 of the first capacitor connection transistor T6.

In a possible embodiment of the present disclosure, as shown in FIG. 1, the shift register unit may further include a first node control transistor T2 and a second capacitor C2.

As shown in FIG. 5, a first gate electrode pattern G21 and a second gate electrode pattern G22 of a gate electrode of the first node control transistor T2 may be coupled to a second electrode plate C2b of the second capacitor C2.

As shown in FIGS. 3, 5 and 6, an orthogonal projection of a first electrode plate C2a of the second capacitor C2 onto the base substrate may be located within an orthogonal projection of the second electrode C2b of the second capacitor C2, and the first electrode plate C2a of the second capacitor C2 may be of an L-like shape.

As shown in FIG. 9, on the basis of FIG. 6, the first electrode plate C2a of the second capacitor C2 may include a second horizontal electrode plate member C2a1, and an orthogonal projection of the gate electrode G2 of the first node control transistor T2 onto the base substrate and an orthogonal projection of the second horizontal electrode plate member C2a1 onto the base substrate may be arranged in the first direction.

In the embodiments of the present disclosure, through providing the electrode plate of C2 with an L-like shape and placing the horizontal electrode plate member in the electrode plate of C2 in a space between T2 of the $n^{th}$ stage of shift register unit and the second node control transistor of the $(n+1)^{th}$ stage of shift register unit, it is able to reduce the transverse width of the shift register unit.

In a possible embodiment of the present disclosure, as shown in FIGS. 3 and 8, the scanning driving circuit may further include a second voltage signal line VGL1 extending in the first direction. The first node control transistor T2 may be arranged at a side of the second capacitor connection transistor T5 away from the first voltage signal line VGH, and between the second voltage signal line VGL1 and the first voltage signal line VGH.

As shown in FIG. 9, the first electrode plate C2a of the second capacitor C2 may further include a second vertical electrode plate member C2a2 coupled to the second horizontal electrode plate member C2a1, and an orthogonal projection of the second vertical electrode plate member C2a2 onto the base substrate may partially overlap an orthogonal projection of the second voltage signal line VGL1 onto the base substrate.

To be specific, the electrode plate of C2 may be of an L-like shape, and the orthogonal projection of the second vertical electrode plate member C2a2 of C2 onto the base substrate may partially overlap the orthogonal projection of the second voltage signal line VGL1 onto the base substrate, so as to reduce the longitudinal height of the shift register unit.

As shown in FIGS. 3, 4 and 9, an orthogonal projection of the second active pattern A2 of T2 onto the base substrate and an orthogonal projection of the second horizontal electrode plate member C2a1 onto the base substrate may be arranged sequentially in the first direction, and the horizontal electrode plate member of C2 may be arranged by using a space between A2 in the $n^{th}$ stage of shift register unit and the $(n+1)^{th}$ stage of shift register unit.

As shown in FIGS. 1 and 3, the scanning driving circuit may further include a first clock signal line CB extending in the first direction and arranged at a side of the second voltage signal line VGL1 away from the first voltage signal line VGH.

The output circuit may include an output transistor T10. As shown in FIG. 5, the at least one shift register unit may further include a second conductive connection member L2 arranged between a gate electrode G10 of the output transistor T10 and the second electrode plate C2b of the second capacitor C2, and the second conductive connection member L2 may be coupled to the gate electrode G10 of the output transistor T10 and the second electrode plate C2b of the second capacitor C2.

The at least one shift register unit may further include a third conductive connection member L3 coupled to the first electrode plate C2a of the second capacitor C2.

As shown in FIGS. 3 and 7, an orthogonal projection of the third conductive connection member L3 onto the base substrate may overlap an orthogonal projection of the first clock signal line CB onto the base substrate at a sixth overlapping region, and the first clock signal line CB may be coupled to the first electrode plate C2a of the second capacitor C2 through at least one sixth via hole H6 in the sixth overlapping region.

In a possible embodiment of the present disclosure, the second conductive connection member L2 may extend in the second direction, and be coupled to the gate electrode G10 of the output transistor T10 and the second electrode plate C2b of the second capacitor C2. The third conductive connection member L3 may extend in the second direction, and be coupled to the first electrode plate C2a of the second capacitor C2 through the sixth via hole H6.

To be specific, as shown in FIGS. 3 and 4, the first capacitor connection transistor T6 may include a first active pattern A1 extending in the first direction. The first active pattern A1 may include a first one of first capacitor connection conductive members L111 and a second one of the first capacitor connection conductive members L112 arranged opposite to each other in the first direction, and a first capacitor connection channel member L12 arranged between the first one of the first capacitor connection conductive members L111 and the second one of the first capacitor connection conductive members L112.

In a possible embodiment of the present disclosure, the first one of the first capacitor connection conductive members L111 may serve as the first electrode S6 of the first capacitor connection transistor T6, and the second one of the first capacitor connection conductive members L112 may serve as the second electrode D6 of the first capacitor connection transistor T6.

In a possible embodiment of the present disclosure, the first active pattern A1 of T6 may extend in the first direction, and T6 may be arranged between T5 and VGH, so as to reduce the transverse width of the shift register unit.

During the implementation, as shown in FIGS. 1 and 3, the at least one shift register unit may include a second transistor T7, a second electrode D7 of which is coupled to the first conductive connection member L1.

As shown in FIGS. 3, 7 and 8, the second electrode D7 of the second transistor T7 may be coupled to the first conductive connection member L1 through a sixth connection via hole H86.

To be specific, as shown in FIG. 4, the first node control transistor T2 may include a second active pattern A2 of a U-like shape. The second active pattern A2 may include a first one first node control channel members A211, a second one of the second node control channel members A212, a first one of first node control conductive members A221, and a second one of the first node control conductive members A222.

As shown in FIG. 5, the gate electrode of the first node control transistor T2 may include a first gate electrode pattern G21 and a second gate electrode pattern G22 coupled to each other. The first gate electrode pattern G21 may correspond to the first one of the first node control channel members A211, and the second gate electrode pattern G22 may correspond to the second one of the first node control channel members A212.

As shown in FIGS. 3 and 4, the first one of the first node control conductive members A221 may serve as the second node D2 of the first node control transistor T2, and the second one of the first node control conductive members A222 may serve as the first electrode S2 of the first node control transistor T2.

As shown in FIGS. 3 and 4, the active pattern of the first node control transistor T2 may be of a U-like structure, so that T2 may be of a double-gate structure. A purpose of the double-gate structure is to enable, when the high voltage signal Vgh is outputted by the shift register unit in the scanning driving circuit at the second phase P2, T10 to be completely turned off, and a high level is applied to the gate electrode of T10 through the source electrode of T5. Hence, at the second phase P2, T5 must be turned on, i.e., the potential at the second node N2 needs to be a low voltage. At the second phase P2, the potential at the gate electrode of T2 may be a high voltage. In order to prevent the potential at the second node N2 from being pulled up due to the current leakage of T2, T2 may be of a double-gate structure, so as to turn off T2 more easily.

In an actual exposing process, when the active pattern of T2 is of a U-like shape without notches, metal may be deposited after the exposure, and the U-like active pattern may become a V-like shape. Hence, in an actual product, considering the actual exposing process, a part of two right-angle portions at an inner side of the U-like active pattern may be removed, so as to enable the resultant pattern to be of the U-like shape as possible, thereby to prevent a width-to-length ratio of T2 from being adversely affected.

In a possible embodiment of the present disclosure, as shown in FIGS. 1 and 3, the shift register unit may further include a second node control transistor T3 and a second capacitor connection transistor T5.

As shown in FIGS. 4 and 8, a second electrode D3 of the second node control transistor T3 may be coupled to the second electrode D2 of the first node control transistor T2 through a fourth conductive connection member L4.

As shown in FIGS. 3, 4, 5 and 8, the at least one shift register unit may further include a fifth conductive connection member L5 coupled to a gate electrode G5 of the second capacitor connection transistor T5. An orthogonal projection of the fifth conductive connection member L5 onto the base substrate may overlap an orthogonal projection of the fourth conductive connection member L4 onto the base substrate at a seventh overlapping region, and the fifth conductive connection member L5 may be coupled to the fourth conductive connection member L4 through a seventh via hole H7 in the seventh overlapping region.

During the implementation, as shown in FIGS. 3, 4, 7 and 8, the second electrode D3 of the second node control transistor T3 may be coupled to the fourth conductive connection member L4 through a seventh connection via hole H87, and the second electrode D2 of the first node control transistor T2 may be coupled to the fourth conductive connection member L4 through an eighth connection via hole H88, so that the second electrode D3 of the second node control transistor T3 may be coupled to the second electrode D2 of the first node control transistor T2.

In a possible embodiment of the present disclosure, the fourth conductive connection members L4 may be arranged in the first direction, so as to reduce the transverse width of the shift register unit.

During the implementation, as shown in FIGS. 1 and 3, the scanning driving circuit may further include a second voltage signal line VGL1 arranged at a side of the second node control transistor T3 away from the first voltage signal line VGH.

As shown in FIGS. 3, 4 and 5, the first electrode S2 of the first node control transistor T2 may be coupled to a sixth conductive connection member L6, and a gate electrode G3 of the second node control transistor T3 may be coupled to a seventh conductive connection member L7. An orthogonal projection of the sixth conductive connection member L6 onto the base substrate may overlap an orthogonal projection of the seventh conductive connection member L7 onto the base substrate at an eighth overlapping region, and the sixth conductive connection member L6 may be coupled to the seventh conductive connection member L7 through an eighth via hole H8 in the eighth overlapping region. A first electrode S3 of the second node control transistor T3 may be coupled to the second voltage signal line VGL1.

As shown in FIGS. 3 and 7, the first electrode S2 of the first node control transistor T2 may be coupled to the sixth conductive connection member L6 through a ninth connection via hole H80, and the sixth conductive connection member L6 may extend in the first direction so as to reduce the transverse width of the shift register unit.

As shown in FIG. 5, the gate electrode G3 of the second node control transistor T3 may be coupled to the seventh conductive connection member L7, and the sixth conductive connection member L6 may be coupled to the seventh conductive connection member L7 through the eighth via hole H8 in the eighth overlapping region, so that the first electrode S2 of the first node control transistor T2 may be coupled to the gate electrode G3 of the second node control transistor T3.

As shown in FIG. 4, the second node control transistor T3 may include a third active pattern A3, which includes a first control conductive member A311, a control channel member A32 and a second control conductive member A312 arranged sequentially in the first direction. The first control conductive member A311 may serve as the first electrode S3 of T3, and the second control conductive member A312 may serve as the second electrode D3 of T3.

To be specific, as shown in FIGS. 1 and 3, the display substrate may further include a second clock signal line CK extending in the first direction.

As shown in FIG. 5, the gate electrode G3 of the second node control transistor T3 may be further coupled to an eighth conductive connection member L8. As shown in FIG. 3, an orthogonal projection of the eighth conductive connection member L8 onto the base substrate may overlap an orthogonal projection of the second clock signal line CK onto the base substrate at a ninth overlapping region. As shown in FIG. 7, the eighth conductive connection member L8 may be coupled to the second clock signal line CK through a ninth via hole H9 in the ninth overlapping region.

Because the gate electrode of T3 is coupled to the second clock signal line CK, the gate electrode of T3 may be arranged close to the second clock signal line CK, so as to provide a reasonable layout.

To be specific, as shown in FIGS. 1 and 3, the scanning driving circuit may include a first clock signal line CB and a second voltage signal line VGL1 each extending in the first direction. The second clock signal line CK may be arranged between the first clock signal line CB and the second voltage signal line VGL1.

In a possible embodiment of the present disclosure, the first clock signal line may also be arranged between the second clock signal line and the second voltage signal line.

During the implementation, as shown in FIGS. 1 and 3, the at least one shift register unit may further include an input transistor T1.

As shown in FIG. 5, a gate electrode G1 of the input transistor T1 may be coupled to the seventh conductive connection member L7. As shown in FIG. 3, a first electrode S1 of the input transistor T1 may be coupled to an input signal end E1, and a second electrode D1 of the input transistor T1 may be coupled to a ninth conductive connection member L9. An orthogonal projection of the ninth conductive connection member L9 onto the base substrate may overlap the orthogonal projection of the second electrode plate C2b of the second capacitor C2 onto the base substrate in a tenth overlapping region, and the ninth conductive connection member L9 may be coupled to the second electrode plate C2b of the second capacitor C2 through a tenth via hole H10 in the tenth overlapping region.

As shown in FIGS. 3, 4, 6, 7 and 8, the first electrode S1 of the input transistor T1 may be coupled to an input conductive connection member L70 through a ninth connection via hole H89, and the input conductive connection member L70 may be coupled to the input signal end E1 through a tenth connection via hole H810, so that the first electrode S1 of the input transistor T1 may be coupled to the input signal end E1.

As shown in FIGS. 3, 4, 6, 7 and 8, the second electrode D1 of the input transistor T1 may be coupled to the ninth conductive connection member L9, and the ninth conductive connection member L9 may be coupled to the second electrode plate C2b of the second capacitor C2 through the tenth via hole H10 in the tenth overlapping region, so that the second electrode D1 of the input transistor T1 may be coupled to the second electrode plate C2b of the second capacitor C2.

As shown in FIGS. 3, 5 and 8, the gate electrode G8 of the first transistor T8 may be coupled to the ninth conductive connection member L9. In a possible embodiment of the present disclosure, the ninth conductive connection member L9 may extend in the first direction, so as to reduce the transverse width of the shift register unit.

In a possible embodiment of the present disclosure, as shown in FIGS. 1 and 3, the shift register unit may further include a third node control transistor T4. As shown in FIG. 5, a gate electrode G4 of the third node control transistor T4 may be coupled to a tenth conductive connection member L10.

As shown in FIGS. 3 and 7, an orthogonal projection of the tenth conductive connection member L10 onto the base substrate may overlap the orthogonal projection of the first clock signal CB onto the base substrate at an eleventh overlapping region, and the tenth conductive connection member L10 may be coupled to the first clock signal line CB through an eleventh via hole H11 in the eleventh overlapping region.

In a possible embodiment of the present disclosure, the tenth conductive connection members L10 may be arranged, but not limited to, in the second direction.

To be specific, as shown in FIGS. 1 and 3, the shift register unit may include a second transistor T7. As shown in FIG. 5, the gate electrode G4 of the third node control transistor T4 may be coupled to a gate electrode G7 of the second transistor T7.

Because the gate electrode G4 of T4 needs to be coupled to the gate electrode G7 of T7, during the arrangement, T4 may be arranged close to T7.

In a possible embodiment of the present disclosure, as shown in FIGS. 1 and 3, the shift register unit may include a second capacitor connection transistor T5.

As shown in FIG. 4, an active layer of the input transistor T1, an active layer of the third node control transistor T4 and an active layer of the second capacitor connection transistor T5 may be formed by a continuous third semiconductor layer 30. The active layer of the input transistor T1 may include a first one of fifth conductive members 311, a fifth channel member 32 and a second one of the fifth conductive members 312 arranged sequentially in the first direction, and the second one of the fifth conductive members 312 may be reused as a first one of sixth conductive members. The active layer of the third node control transistor T4 may include the first one of the sixth conductive members, a sixth channel member 34 and a second one of the sixth conductive members 332 arranged sequentially in the first direction, and the second one of the sixth conductive members 332 may be reused as a first one of seventh conductive members. The active layer of the second capacitor connection transistor T5 may include the first one of the seventh conductive members, a seventh channel member 36 and a second one of the seventh conductive members 352 arranged sequentially in the first direction.

In a possible embodiment of the present disclosure, as shown in FIGS. 3 and 4, the first one of the fifth conductive members 311 may serve as the first electrode S1 of the input transistor T1, the second one of the fifth conductive members 312 may serve as the second electrode D1 of the input transistor T1, the second one of the sixth conductive members may serve as the first electrode S4 of the third node control transistor T4, and the second one of the seventh conductive members may serve as the first electrode S5 of the second capacitor connection transistor T5.

In addition, as shown in FIG. 3, the second electrode D1 of the input transistor T1 may be reused as the second electrode D4 of the third node control transistor T4, and the first electrode S4 of the third node control transistor T4 may be reused as the second electrode D5 of the second capacitor connection transistor T5. In other words, for the display substrate in the embodiments of the present disclosure, any two adjacent ones of the input transistor T1, the third node control transistor T4 and the second capacitor connection transistor T5 may be directly coupled to each other through the conductive member of the third semiconductor layer 30, so as to reduce an area occupied by each of T1, T4 and T5 in the first direction.

To be specific, the scanning driving circuit may further include a second voltage signal line, a first clock signal line, a second clock signal line and a signal output line. The second voltage signal line, the first clock signal line and the second clock signal line may extend in the first direction. An orthogonal projection of the second voltage signal line onto the base substrate, an orthogonal projection of the first clock signal line onto the base substrate, and an orthogonal projection of the second clock signal line onto the base substrate may be arranged at a side of an orthogonal projection of the shift register unit onto the base substrate away from the display region of the display substrate. The signal output line may extend in a second direction intersecting the first direction.

To be specific, positions of the first clock signal line, the second clock signal line and the second voltage signal line may be set according to the practical need. For example, the first clock signal line, the second clock signal line and the second voltage signal line may be arranged at an edge of the display substrate in such a manner that the orthogonal projection of the second voltage signal line onto the base substrate, the orthogonal projection of the first clock signal line onto the base substrate, and the orthogonal projection of the second clock signal line onto the base substrate are arranged at a side of the orthogonal projection of the shift register unit onto the base substrate away from the display region of the display substrate. In this regard, during the arrangement of the shift register unit, it is able to prevent the transistors in the shift register unit from overlapping the first clock signal line, the second clock signal line and the second voltage signal line to a great extent, thereby to improve the operation performance of the shift register unit.

In addition, when the first clock signal line, the second clock signal line and the second voltage signal line extend in the first direction, it is able to provide the display substrate with a narrow bezel.

During the implementation, a phase of a first clock signal outputted by the first clock signal line may be, but not limited to, reverse to a phase of a second clock signal outputted by the second clock signal line.

During the implementation, as shown in FIGS. 1 and 3, the scanning driving circuit may include a first clock signal line VGH, a third voltage signal line VGL2, a second voltage signal line VGL1, a first clock signal line CB, a second clock signal line CK and a signal output line EOUT. The at least one shift register unit may further include an output capacitor C3, a first capacitor C1, a second capacitor C2, an output resetting transistor T9, an output transistor T10, a first transistor T8, a second transistor T7, a first capacitor connection transistor T6, a second capacitor connection transistor T5, a first node control transistor T2, a second node control transistor T3, an input transistor T1 and a third node control transistor T4.

The output resetting transistor T9 and the output transistor T10 may be arranged in the first direction. A first electrode S9 of the output resetting transistor T9 may be coupled to the first voltage signal line VGH, and a first electrode S10 of the output transistor T10 may be coupled to the third voltage signal line VGL2.

The output transistor T10 and the signal output line EOUT may be arranged in the first direction, and a second electrode D9 of the output resetting transistor T9 and a second electrode D10 of the output transistor T10 may be coupled to the signal output line EOUT. The signal output line EOUT may extend in a second direction intersecting the first direction.

A second electrode D8 of the first transistor T8 may be coupled to a second electrode plate C3b of the output capacitor C3, a first electrode S8 of the first transistor T8 may be coupled to the first voltage signal line VGH, and a gate electrode G8 of the first transistor T8 may be coupled to a second electrode D4 of the third node control transistor T4.

A second electrode D7 of the second transistor T7 may be coupled to a first electrode plate C1a of the first capacitor C1, a first electrode S7 of the second transistor T7 may be coupled to the second electrode plate C3b of the output capacitor C3, and a gate electrode G7 of the second transistor T7 may be coupled to a gate electrode G4 of the third node control transistor T4.

A gate electrode G6 of the first capacitor connection transistor T6 and a gate electrode G5 of the second capacitor connection transistor T5 may be coupled to a second electrode plate C1b of the first capacitor C1, a second electrode D6 of the first capacitor connection transistor T6 may be coupled to the first electrode plate C1a of the first capacitor C1, and a first electrode S6 of the first capacitor connection transistor T6 may be coupled to the gate electrode G7 of the second transistor T7.

A first electrode S5 of the second capacitor connection transistor T5 may be coupled to the first voltage signal line VGH, the gate electrode G5 of the second capacitor connection transistor T5 may be coupled to a second electrode D3 of the second node control transistor T3, and a second electrode D5 of the second capacitor connection transistor T5 may be coupled to a first electrode S4 of the third node control transistor T4.

A first electrode S2 of the first node control transistor T2 may be coupled to a gate electrode G3 of the second node control transistor T3, and a second gate electrode G2 of the first node control transistor T2 may be coupled to the second electrode plate C2b of the second capacitor C2.

The second electrode D3 of the second node control transistor T3 may be coupled to a second electrode D2 of the first node control transistor T2, the gate electrode G3 of the second node control transistor T3 may be coupled to the second clock signal line CK, and a first electrode S3 of the second node control transistor T3 may be coupled to the second voltage signal line VGL1.

A gate electrode G1 of the input transistor T1 may be coupled to the gate electrode G3 of the second node control transistor T3, a first electrode S1 of the input transistor T1 may be coupled to an input signal end E1, and a second electrode D1 of the input transistor T1 may be coupled to the second electrode plate C2b of the second capacitor C2. The gate electrode G4 of the third node control transistor T4 may be coupled to the first clock signal line CB.

A first electrode plate C3a of the output capacitor C3 may be coupled to the first voltage signal line VGH, and the second electrode plate C3b of the output capacitor C3 may be coupled to the gate electrode G9 of the output resetting transistor T9.

The second electrode plate C2b of the second capacitor C2 may be coupled to the gate electrode G10 of the output transistor T10, and the first electrode plate C2a of the second capacitor C2 may be coupled to the first clock signal line CB. The second electrode D9 of the output resetting transistor T9 and the second electrode D10 of the output transistor T10 may be coupled to the signal output line EOUT.

In the embodiments of the present disclosure, in a direction close to the display region, the first clock signal line, the second clock signal line and the second voltage signal may be arranged sequentially, or in a direction close to the display region, the second clock signal line, the first clock signal line and the second voltage signal line may be arranged sequentially.

As shown in FIG. 9, on the basis of FIG. 6, the first electrode plate C1a of the first capacitor C1 may include a first horizontal electrode plate member C1a1 and a first vertical electrode plate member C1a2.

As shown in FIG. 3, the output resetting transistor T9 and the output transistor T10 may be arranged between the first voltage signal line VGH and the third voltage signal line VGL2. The output resetting transistor T9, the output transistor T10 and the signal output line EOUT may be arranged sequentially in the first direction.

The second voltage signal line VGL1 may be arranged at a side of the first voltage signal line VGH away from the third voltage signal line VGL2. The first capacitor C1, the first transistor T8, the second transistor T7, the first capacitor connection transistor T6, the second capacitor connection transistor T5, the first node control transistor T2, the second node control transistor T3, the input transistor T1 and the third node control transistor T4 may be arranged between the first voltage signal line VGH and the second voltage signal line VGL1.

The first transistor T8, the second transistor T7 and the first vertical electrode plate member C1a2 may be arranged sequentially in the first direction, the input transistor T1, the third node control transistor T4, the second capacitor connection transistor T5 and the first horizontal electrode plate member C1a1 may be arranged sequentially in the first direction, and the second node control transistor T3 and the first node control transistor T2 may be arranged sequentially in the first direction.

An orthogonal projection of the gate electrode G6 of the first capacitor connection transistor T6 onto the base substrate may be arranged between an orthogonal projection of the second electrode plate C1b of the first capacitor C1 onto the base substrate and an orthogonal projection of the first voltage signal line VGH onto the base substrate.

An orthogonal projection of the gate electrode G7 of the second transistor T7 onto the base substrate may be arranged between an orthogonal projection of the gate electrode G4 of the third node control transistor T4 onto the base substrate and the orthogonal projection of the first voltage signal line VGH onto the base substrate.

An orthogonal projection of the gate electrode G2 of the first node control transistor T2 onto the base substrate may be arranged between an orthogonal projection of the second voltage signal line VGL1 onto the base substrate and an orthogonal projection of the first electrode plate C1a of the first capacitor C1 onto the base substrate.

A minimum distance between the orthogonal projection of the gate electrode G2 of the first node control transistor T2 onto the base substrate and the orthogonal projection of the second voltage signal line VGL1 onto the base substrate may be greater than a minimum distance between the orthogonal projection of the gate electrode G5 of the second capacitor connection transistor T5 onto the base substrate and the orthogonal projection of the second voltage signal line VGL1 onto the base substrate.

In the layout mode as shown in FIG. 3, the output resetting transistor T9 may be coupled to the first voltage signal line VGH, and the output transistor T10 may be coupled to the third voltage signal line VGL2. Hence, the output resetting transistor T9 and the output transistor T10 may be arranged between the first voltage signal line VGH and the third voltage signal line VGL2, and the signal output line EOUT may be arranged in such a manner as to make full use of a space between T10 of the $n^{th}$ stage of shift register unit and the output resetting transistor of the $(n+1)^{th}$ stage of shift register unit, so that T9 and T10 may be arranged between VGH and VGL2. In addition, no signal line or member of the other transistor may be arranged between the first voltage signal line VGH and an output circuit (including T9 and T10), and no signal line or member of the other transistor may be arranged between the third voltage signal line VGL2 and the output circuit (including T9 and T10), so as to reduce distances from VGH to T9 and T10, and reduce distances from VGL2 to T9 and T10, thereby to reduce the transverse width of the shift register unit.

In the layout mode as shown in FIG. 3, T8 may be arranged at a side of the first voltage signal line VGH away from the third voltage signal line VGL2, and the orthogonal projection of the electrode plate of the output capacitor C3 onto the base substrate may partially overlap the orthogonal projection of the first voltage signal line VGH onto the base substrate, so as to reduce a distance between the first electrode S8 of the first transistor T8 and the first voltage signal line VGH and reduce a distance between the second electrode D8 of the first transistor T8 and the second electrode plate C3b of the output capacitor C3, so that T8 may be coupled to the first voltage signal line VGH and the second electrode plate C3b of the output capacitor C3 conveniently, thereby to provide a compact space as well as a more reasonable layout.

In the layout mode as shown in FIG. 3, T5 may be arranged close to T6, so as to adjust a shape of the electrode plate of C1. When the first electrode plate C1a of C1 is of an L-like shape, it is able to make full use of a wiring space between the gate electrode of T5 and the second conductive connection member, and provide a more reasonable layout, thereby to effectively reduce the transverse width of the shift register unit as well as the longitudinal height of the shift register unit.

In the embodiments of the present disclosure, the minimum distance between the orthogonal projection of the gate electrode G2 of the first node control transistor T2 onto the base substrate and the orthogonal projection of the third voltage signal line VGL2 onto the base substrate in the second direction may refer to a minimum distance between any point on an edge line of the orthogonal projection of G2 onto the base substrate and an edge line of the orthogonal projection of VGL2 onto the base substrate in the second direction. The minimum distance between the orthogonal projection of the gate electrode G5 of the second capacitor connection transistor T5 onto the base substrate and the orthogonal projection of the third voltage signal line VGL2 onto the base substrate in the second direction may refer to a minimum distance between any point on an edge line of the orthogonal projection of G5 onto the base substrate and an edge line of the orthogonal projection of VGL2 onto the base substrate in the second direction.

During the implementation, an orthogonal projection of the first electrode plate C3a of the output capacitor C3 onto the base substrate may overlap the orthogonal projection of the first voltage signal line VGH onto the base substrate at a signal line overlapping region, and an orthogonal projection of the second electrode plate C3b of the output capacitor C3 onto the base substrate may partially overlap the orthogonal projection of the first voltage signal line VGH onto the base substrate. An orthogonal projection of the first electrode plate C2a of the second capacitor C2 onto the base substrate may be located within an orthogonal projection of the second electrode plate C2b of the second capacitor C2 onto the base substrate. The first electrode plate C2a of the second capacitor C2 may be of an L-like shape.

As shown in FIG. 9, the first electrode plate C2a of the second capacitor C2 may include a second horizontal electrode plate member C2a1 and a second vertical electrode plate member C2a2. The gate electrode G2 of the first node control transistor T2 and the second horizontal electrode plate member C2a1 may be arranged in the first direction, and an orthogonal projection of the second vertical electrode plate member C2a2 onto the base substrate may partially overlap the orthogonal projection of the second voltage signal line VGL1 onto the base substrate.

In the layout mode as shown in FIG. 3, through providing the electrode plate of C2 with an L-like shape and placing the horizontal electrode plate member in the electrode plate of C2 in a space between T2 of the $n^{th}$ stage of shift register unit and the second node control transistor of the $(n+1)^{th}$ stage of shift register unit, it is able to reduce the transverse width of the shift register unit.

In the embodiments of the present disclosure, a first gate insulation layer may be further arranged between the semiconductor layer in FIG. 4 and the first gate metal layer in FIG. 5, a second gate insulation layer may be further arranged between the first gate metal layer in FIG. 5 and the second gate metal layer in FIG. 6, and an insulation layer may be further arranged between the second gate metal layer in FIG. 6 and the source-drain metal layer in FIG. 8.

During the manufacture of the display substrate in the embodiments of the present disclosure, at first a semiconductor material layer may be arranged on the base substrate, and then patterned to form the active layers of the transistors. As shown in FIG. 4, the first semiconductor layer 10, the second semiconductor layer 20, the third semiconductor layer 30, the first active pattern A1 of the first capacitor connection transistor T6, the second active pattern A2 of the first node control transistor T2 and the third active pattern A3 of the second node control transistor T3 may be formed.

The first gate insulation layer may be formed at a surface of the active layer away from the base substrate. The first gate metal layer may be formed at a surface of the first gate insulation layer away from the active layer, and then patterned to form the gate electrodes of the transistors in the shift register unit, the second electrode plate of the output capacitor C3, the second electrode plate of the first capacitor C1 and the second electrode plate of the second capacitor C2 as shown in FIG. 5.

A portion of the active layer not covered by the gate electrodes may be doped by using the gate electrodes of the transistors as a mask, so as to enable the portion of the active layer not covered by the gate electrodes to form the conductive members, and enable a portion of the active layer covered by the gate electrodes to form the channel members. The conductive members may serve as the first electrodes or the second electrodes, or the conductive members may be coupled to the first electrodes or the second electrodes.

The second gate insulation layer may be arranged at a surface of the first gate metal layer away from the first gate insulation layer.

The second gate metal layer may be arranged at a surface of the second gate insulation layer away from the first gate metal layer, and then patterned, so as to form the signal output line EOUT, the input signal end R1, the first electrode plate of the output capacitor C3, the first electrode plate of the first capacitor C1 and the first electrode plate of the second capacitor C2 as shown in FIG. 6.

The insulation layer may be arranged at a surface of the second gate metal layer away from the second gate insulation layer.

As shown in FIG. 7, a plurality of via holes may be formed in the base substrate with the active layer, the first gate insulation layer, the first gate metal layer, the second gate insulation layer, the second gate metal layer and the insulation layer.

The source-drain metal layer may be arranged at a surface of the insulation layer away from the second gate metal layer, and then patterned to form the first voltage signal line VGH, the second voltage signal line VGL1, the third voltage signal line VGL2, the first clock signal line CB, the second clock signal line CK, the start signal line ESTV, the second electrode D9 of the output resetting transistor T9, the first electrode S9 of the output resetting transistor T9, the second electrode D10 of the output transistor T10 and the first electrode S10 of the output transistor T10 as shown in FIG. 8.

The present disclosure further provides in some embodiments a method of manufacturing a display substrate, which includes forming a first voltage signal line and a scanning driving circuit on a base substrate. The first voltage signal line extends in a first direction, the scanning driving circuit includes a plurality of shift register units, and at least one of the plurality of shift register units includes an output capacitor and a first transistor. The method further includes forming the output capacitor and the first transistor in such a manner that a first electrode of the first transistor is coupled to the first voltage signal line and a second electrode of the first transistor is coupled to an electrode plate of the output capacitor. A maximum distance between an orthogonal projection of the first electrode of the first transistor onto the base substrate and an orthogonal projection of the first voltage signal line onto the base substrate is smaller than a first predetermined distance in a second direction, a maximum distance between an orthogonal projection of the second electrode of the first transistor onto the base substrate and an orthogonal projection of the electrode plate of the output capacitor onto the base substrate is smaller than a second predetermined distance in the second direction, and the first direction intersects the second direction.

In the embodiments of the present disclosure, the first electrode of the first transistor may be coupled to the first voltage signal line and the second electrode of the first transistor may be coupled to the second electrode plate of the output capacitor, so during the manufacture of the display substrate, the closer the first transistor to the first voltage signal line and the output transistor, the more reasonable the layout. In the embodiments of the present disclosure, the first transistor may be arranged at a side of the first voltage signal line away from the second voltage signal line, the maximum distance between the orthogonal projection of the first electrode of the first transistor onto the base substrate and the orthogonal projection of the first voltage signal line onto the base substrate in the second direction maybe smaller than the first predetermined distance, and the maximum distance between the orthogonal projection of the second electrode of the first transistor onto the base substrate and the orthogonal projection of the electrode plate of the output capacitor onto the base substrate may be smaller than the second predetermined distance, so as to provide a reasonable layout.

During the implementation, the first predetermined distance may be greater than or equal to 20 μm and smaller than or equal to 30 μm, and the second predetermined distance may be greater than or equal to 25 μm and smaller than or equal to 35 μm.

In a possible embodiment of the present disclosure, the at least one shift register unit may further include a second transistor. The forming the first transistor and the second transistor may include: forming a second semiconductor layer extending in the first direction; forming a first gate metal layer at a surface of the second semiconductor layer away from the base substrate, and patterning the first gate metal layer to form a gate electrode of the first transistor and a gate electrode of the second transistor; and doping a portion of the second semiconductor layer not covered by the gate electrodes of the first transistor and the second transistor by using the gate electrodes of the first transistor and the gate electrode of the second transistor as a mask, so as to enable the portion of the second semiconductor layer not covered by the gate electrodes to form conductive members, and enable a portion of the second semiconductor layer covered by the gate electrodes to form channel members. The second semiconductor layer may include a first one of third conductive members, a third channel member, a second one of the third conductive members, a fourth channel member and a second one of fourth conductive members arranged sequentially in the first direction, the second one of the third conductive members may be reused as a first one of the fourth conductive members, the first one of the third conductive members may be reused as the first electrode of the first transistor, the second one of the third conductive members may be reused as the second electrode of the first transistor, and the second one of the fourth conductive members may be reused as the second electrode of the second transistor.

During the implementation, the electrode plate of the output capacitor coupled to the second electrode of the first transistor may be a second electrode plate of the output capacitor. The forming the output capacitor may include: patterning the first gate metal layer to form the second electrode plate of the output capacitor; forming a second gate metal layer at a surface of the first gate metal layer away from the second semiconductor layer, and patterning the second gate metal layer to form a first electrode plate of the output capacitor; and forming a source-drain metal layer at a surface of the second gate metal layer away from the first gate metal layer, and patterning the source-drain metal layer to form an electrode plate conductive connection member, the first voltage signal line and a second voltage signal line. An orthogonal projection of a first electrode plate of the output capacitor onto the base substrate may overlap the orthogonal projection of the first voltage signal line onto the base substrate at a signal line overlapping region, and the first electrode plate of the output capacitor may be coupled to the first voltage signal line through at least one signal line via hole in the signal line overlapping region. An orthogonal projection of the electrode plate conductive connection member onto the base substrate may overlap an orthogonal projection of the second electrode plate of the output capacitor onto the base substrate at an electrode plate overlapping region, and the electrode plate conductive connection member may be coupled to the second electrode plate of the output capacitor through at least one electrode plate via hole in the electrode plate overlapping region. The first voltage signal line and the second voltage signal line may extend in the first direction, the first transistor and the second transistor may be arranged between the first voltage signal line and the second voltage signal line, and the second voltage signal line may be arranged at a side of the first voltage signal line away from a display region.

In the embodiments of the present disclosure, an active layer of the first transistor and an active layer of the second transistor may be formed by a continuous second semiconductor layer extending in the first direction. The active layer of the first transistor may include a first one of third conductive members, a third channel member and a second one of the third conductive members arranged sequentially in the first direction, and the second one of the third conductive members may be reused as a first one fourth conductive members. The active layer of the second transistor may include the first one of the fourth conductive members, a fourth channel member and a second one of the fourth conductive members arranged sequentially in the first direction. The first one of the third conductive members may serve as the first electrode of the first transistor, the second one of the third conductive members may serve as the second electrode of the first transistor, and the second one of the fourth conductive members may serve as the second electrode of the second transistor. In the embodiments of the present disclosure, the second transistor may be arranged between the first transistor and the first capacitor, and the second electrode of the first transistor may be reused as the second electrode of the second transistor, so as to reduce the longitudinal height of the shift register unit while reducing the transverse width thereof.

In a possible embodiment of the present disclosure, the at least one shift register unit may include an output circuit. The method may further include forming a third voltage signal line on the base substrate, and forming transistors of the output circuit between the first voltage signal line and the third voltage signal line.

According to the method of manufacturing the display substrate in the embodiments of the present disclosure, the output circuit may be arranged between the first voltage signal line and the third voltage signal line. In this regard, in a spatial structure, the first voltage signal line may be arranged at a side of the output circuit away from the display region, and no signal line or member of the other transistor may be arranged between the first voltage signal line and the output circuit. The third voltage signal line may be arranged at a side of the output circuit adjacent to the display region, and no signal line or member of the other transistor may be arranged between the third voltage signal line and the output circuit. As a result, it is able to reduce a distance between the first voltage signal line and the output circuit and a distance between the third voltage signal line and the output circuit, thereby to reduce the transverse width of the shift register unit.

During the implementation, the first voltage signal line and the third voltage signal line may extend in the first direction.

During the implementation, the first voltage signal line may be arranged at a side of the third voltage signal line away from the display region.

In a possible embodiment of the present disclosure, the output circuit may include an output transistor and an output resetting transistor. The forming the transistors of the output circuit may include: forming a first semiconductor layer between the first voltage signal line and the third voltage signal line; forming a first gate metal layer at a surface of the first semiconductor layer away from the base substrate, and patterning the first gate metal layer, so as to form a gate electrode of the output transistor and a gate electrode of the output resetting transistor; and doping a portion of the first semiconductor layer not covered by the gate electrode of the output transistor and the gate electrode of the output resetting transistor by using the gate electrode of the output transistor and the gate electrode of the output resetting transistor as a mask, so as to enable the portion of the first semiconductor layer not covered by the gate electrodes to form the conductive members and enable a portion of the first semiconductor layer covered by the gate electrodes to form the channel members.

During the implementation, an active layer of the output transistor and an active layer of the output resetting transistor may be formed by, but not limited to, the continuous first semiconductor layer.

In the embodiments of the present disclosure, the active layer of the output transistor and the active layer of the output resetting transistor may be formed by the continuous first semiconductor layer extending in the first direction. The active layer of the output resetting transistor may include at least one first conductive member and at least one first channel member arranged opposite to each other in the first direction, and each first channel member may be arranged between two adjacent first conductive members. The active layer of the output transistor may include at least two second conductive members and at least one second channel member arranged opposite to the second conductive members in the first direction, and each second channel member may be arranged between two adjacent second conductive members. A first conductive member in the active layer of the output resetting transistor closest to the active layer of the output transistor may be reused as a second conductive member of the output transistor, so as to further reduce a layout space of the output transistor and the output resetting transistor, thereby to provide the display substrate with a narrow bezel.

During the implementation, the method may further include forming a second gate metal layer at a surface of the first gate metal layer away from the first semiconductor layer, and patterning the second gate metal layer to form a signal output line extending in the second direction. An orthogonal projection of the first semiconductor layer onto the base substrate and an orthogonal projection of the signal output line onto the base substrate may be arranged in the first direction intersecting the second direction.

In the embodiments of the present disclosure, when the orthogonal projection of the first semiconductor layer onto the base substrate and the orthogonal projection of the signal output line onto the base substrate are arranged in the first direction, it is able to reduce the transverse width of the shift register unit.

During the implementation, the forming the first voltage signal line and the third voltage signal line may include forming a source-drain metal layer at a surface of the second gate metal layer away from the first gate metal layer, and patterning the source-drain metal layer to form the first voltage signal line and the third voltage signal line.

In a possible embodiment of the present disclosure, the at least one shift register unit may further include a first capacitor, and at least two transistors coupled to a first electrode plate of the first capacitor. The method may further include forming the first capacitor and the at least two transistors at a side of the first voltage signal line away from the third voltage signal line. A maximum distance between an orthogonal projection of a gate electrode of each of the at least two transistors onto the base substrate and the orthogonal projection of the first voltage signal line onto the base substrate in the second direction may be smaller than a third predetermined distance.

During the implementation, the transistor coupled to the second electrode plate of the first capacitor may also be coupled to the first voltage signal line, so the transistor coupled to the second electrode plate of the first capacitor should be better arranged close to the first voltage signal line. In the embodiments of the present disclosure, when the maximum distance between the orthogonal projection of the gate electrode of the transistor coupled to the second electrode plate of the first capacitor and the orthogonal projection of the first voltage signal line onto the base substrate in the second direction is smaller than the third predetermined distance, it is able to reduce the transverse width of the shift register unit.

In a possible embodiment of the present disclosure, the at least two transistors may include a first capacitor connection transistor and a second capacitor connection transistor. The forming the first capacitor connection transistor and the second capacitor connection transistor may include: forming an active layer of the first capacitor connection transistor and an active layer of the second capacitor connection transistor on the base substrate; forming a first gate metal layer at a surface of each active layer away from the base substrate, and patterning the first gate metal layer, so as to form a gate electrode of the first capacitor connection transistor, a gate electrode of the second capacitor connection transistor and the second electrode plate of the first capacitor, the gate electrode of the first capacitor connection transistor and the gate electrode of the second capacitor connection transistor being coupled to the second electrode plate of the first capacitor; doping a portion of each active layer not covered by the gate electrode of the first capacitor connection transistor and the gate electrode of the second capacitor connection transistor by using the gate electrode of the first capacitor connection transistor and the gate electrode of the second capacitor connection transistor as a mask, so as to enable the portion of each active layer not covered by the gate electrodes to form conductive members, and enable a portion of each active layer covered by the gate electrodes to form channel members, the active layer of the first capacitor connection transistor including a first one of first capacitor connection conductive members, a first capacitor connection channel member and a second one of the first capacitor connection conductive members arranged sequentially in the first direction, the active layer of the second capacitor connection transistor including a first one of seventh conductive members, a seventh channel member, and a second one of the seventh conductive members arranged sequentially in the first direction, the first one of the first capacitor connection conductive members being used as a first electrode of the first capacitor connection transistor, the second one of the first capacitor connection conductive members being used as a second electrode of the first capacitor connection transistor; forming a second gate metal layer at a surface of the first gate metal layer away from the active layer, and patterning the second gate metal layer to form the first electrode plate of the first capacitor; and forming a source-drain metal layer at a surface of the second gate metal layer away from the first gate metal layer, and patterning the source-drain metal layer, so as to form the first voltage signal line, the third voltage signal line and a first conductive connection member. An orthogonal projection of the first conductive connection member onto the base substrate may overlap the orthogonal projection of the first electrode plate of the first capacitor onto the base substrate at a fifth overlapping region, and the first conductive connection member may be coupled to the first electrode plate of the first capacitor through at least one fifth via hole in the fifth overlapping region.

During the implementation, the first one of the seventh conductive member can be used as the second electrode of the second capacitor connection transistor, and the second one of the seventh conductive member can be used as the second electrode of the second capacitor connection transistor. The first electrode of the second capacitor connecting transistor is coupled to the first voltage signal line. The distance between the orthographic projection of the gate electrode of the first capacitor connection transistor on the base substrate and the orthographic projection of the first voltage signal line on the substrate in the second direction is smaller than the distance between the orthographic projection of the gate electrode of the second capacitor connection transistor on the base substrate and the orthographic projection of the first voltage signal line on the base substrate in the second direction.

During the implementation, a distance between the orthogonal projection of the gate electrode of the first capacitor connection transistor onto the base substrate and the orthogonal projection of the first voltage signal line onto the base substrate in the second direction may be smaller than a distance between the orthogonal projection of the gate electrode of the second capacitor connection transistor onto the base substrate and the orthogonal projection of the first voltage signal line onto the base substrate in the second direction, i.e., the second capacitor connection transistor may be arranged at a side of the first capacitor connection transistor away from the first voltage signal line.

In a possible embodiment of the present disclosure, a maximum distance between the gate electrode of the first capacitor connection transistor and the gate electrode of the second capacitor connection transistor in the second direction may be smaller than a fourth predetermined distance. The orthogonal projection of the first electrode plate of the first capacitor onto the base substrate may be located within the orthogonal projection of the second electrode plate of the first capacitor onto the base substrate. The first electrode plate of the first capacitor may be of an L-like shape.

In the embodiments of the present disclosure, the first capacitor connection transistor may be arranged close to the second capacitor connection transistor, so as to adjust the shape of the electrode plate of the first capacitor. When the first electrode plate of the first capacitor is of an L-like shape, it is able to make full use of a wiring space between the gate electrode of the second capacitor connection transistor and the second conductive connection member and provide a more reasonable layout, thereby to reduce the transverse width and the longitudinal height of the shift register unit.

In a possible embodiment of the present disclosure, the at least one shift register unit may further include a first node control transistor and a second capacitor. The forming the first node control transistor and the second capacitor may include: forming an active layer of the first node control transistor on the base substrate while forming the active layers of the first capacitor connection transistor and the second capacitor connection transistor on the base substrate; patterning the first gate metal layer, so as to form a gate electrode of the first node control transistor and a second electrode plate of the second capacitor, and enable the gate electrode of the first node control transistor to be coupled to the second electrode plate of the second capacitor; doping a portion of the active layer of the first node control transistor not covered by the gate electrode of the first node control transistor by using the gate electrode of the first node control transistor as a mask; and patterning the second gate metal layer, so as to form a first electrode plate of the second capacitor. An orthogonal projection of the first electrode plate of the second capacitor onto the base substrate maybe located within the orthogonal projection of the second electrode plate of the second capacitor onto the base substrate, and the first electrode plate of the second capacitor may be of an L-like shape. The first electrode plate of the second capacitor may include a second horizontal electrode plate member, and an orthogonal projection of the gate electrode of the first node control transistor onto the base substrate and an orthogonal projection of the second horizontal electrode plate member onto the base substrate may be arranged in the first direction.

In the embodiments of the present disclosure, through providing the electrode plate of the second transistor with an L-like shape and placing the horizontal electrode plate member in the first electrode plate of the second transistor in a space between the first node control transistor and a next stage of shift register unit, it is able to reduce the transverse width of the shift register unit.

During the implementation, the method may further include patterning the source-drain metal layer to form the second voltage signal line extending in the first direction. The first node control transistor may be arranged at a side of the second capacitor connection transistor away from the first voltage signal line, and between the second voltage signal line and the first voltage signal line. The first electrode plate of the second capacitor may further include a second vertical electrode plate member coupled to the second horizontal electrode plate member, and an orthogonal projection of the second vertical electrode plate member onto the base substrate may partially overlap the orthogonal projection of the second voltage signal line onto the base substrate.

To be specific, the first electrode plate of the second capacitor may be of an L-like shape, and the orthogonal projection of the second vertical electrode plate member of the second capacitor onto the base substrate may partially overlap the orthogonal projection of the third voltage signal line onto the base substrate, so as to reduce the longitudinal height of the shift register unit.

The present disclosure further provides in some embodiments a display device including the above-mentioned display substrate.

The display substrate mentioned hereinabove has a narrow bezel, so when the display device includes the display substrate, it is also able to provide a narrow bezel, which will not be particularly defined herein.

The display device in the embodiments of the present disclosure may be any product or member having a display function, e.g., mobile phone, flat-panel computer, television, display, laptop computer, digital photo frame or navigator.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A scanning driving circuit, comprising a plurality of shift register units and a first voltage signal line extending in a first direction, wherein
at least one of the plurality of shift register units comprises an output capacitor, a first capacitor and a second capacitor,
the second capacitor, the first capacitor and the output capacitor are arranged in sequence along a second direction, the second direction is substantially perpendicular to the first direction, wherein an orthogonal projection of the second capacitor on a straight line extending along the second direction forms a first segment, an orthogonal projection of the first capacitor on the straight line extending along the second direction forms a second segment, the first segment does not overlap the second segment, an orthogonal projection of the output capacitor on the straight line extending along the second direction forms a third segment, the second segment does not overlap the third segment;

wherein an orthogonal projection of the first capacitor on a straight line extending along the first direction forms a fourth segment, an orthogonal projection of the second capacitor on the straight line extending along the first direction forms a fifth segment, the fourth segment is within the fifth segment wherein an orthogonal projection of the output capacitor on the straight line extending along the first direction forms a sixth segment, the fourth segment is within the sixth segment.

2. The scanning driving circuit according to claim 1, wherein at least one of the plurality of shift register units further comprises a first transistor, a first electrode of the first transistor is coupled to the first voltage signal line, and a second electrode of the first transistor is coupled to an electrode plate of the output capacitor; and
   a maximum distance in a second direction between an orthogonal projection of a furthest point of the first electrode of the first transistor onto a base substrate and an orthogonal projection of a furthest point of the first voltage signal line onto the base substrate is smaller than a first predetermined distance, a maximum distance in the second direction between an orthogonal projection of a furthest point of the second electrode of the first transistor onto the base substrate and an orthogonal projection of a furthest point of the electrode plate of the output capacitor onto the base substrate is smaller than a second predetermined distance.

3. The scanning driving circuit according to claim 2, wherein the first predetermined distance is greater than or equal to 20 μm and smaller than or equal to 30 μm, and the second predetermined distance is greater than or equal to 25 μm and smaller than or equal to 35 μm.

4. The scanning driving circuit according to claim 2, wherein an orthogonal projection of a first electrode plate of the output capacitor onto the base substrate overlaps the orthogonal projection of the first voltage signal line onto the base substrate at a signal line overlapping region, and the first electrode plate of the output capacitor is coupled to the first voltage signal line through at least one signal line via hole in the signal line overlapping region;
   wherein an electrode plate of the output capacitor coupled to the second electrode of the first transmission is a second electrode plate of the output capacitor;
   the at least one shift register unit further comprises an electrode plate conductive connection member coupled to the second electrode of the first transistor;
   an orthogonal projection of the electrode plate conductive connection member onto the base substrate overlaps an orthogonal projection of the second electrode plate of the output capacitor onto the base substrate at an electrode plate overlapping region, and the electrode plate conductive connection member is coupled to the second electrode plate of the output capacitor through at least one electrode plate via hole in the electrode plate overlapping region.

5. The scanning driving circuit according to claim 4, wherein the orthogonal projection of the first electrode plate of the output capacitor onto the base substrate at least partially overlaps the orthogonal projection of the second electrode plate of the output capacitor onto the base substrate.

6. The scanning driving circuit according to claim 2, wherein the first transistor and the second transistor are arranged at a side of the first voltage signal line away from a display region,
   an orthogonal projection of a second electrode plate of the second capacitor onto the base substrate overlaps an orthogonal projection of the ninth conductive connection member onto the base substrate at a tenth overlapping region, the ninth conductive connection member is coupled to the second electrode plate of the second capacitor through a tenth via hole in the tenth overlapping region, and
   the gate electrode of the first transistor is coupled to the ninth conductive connection member so that the gate electrode of the first transistor is coupled to the second electrode plate of the second capacitor.

7. The scanning driving circuit according to claim 2, wherein the at least one first shift register unit further comprises a first node control transistor,
   a gate electrode of the first node control transistor is coupled to a second electrode plate of the second capacitor,
   an orthogonal projection of a first electrode plate of the second capacitor onto the base substrate is located within an orthogonal projection of the second electrode plate of the second capacitor onto the base substrate,
   the first electrode plate of the second capacitor is of an L-like shape
   the first electrode plate of the second capacitor comprises a second horizontal electrode plate member, and
   an orthogonal projection of the gate electrode of the first node control transistor onto the base substrate and an orthogonal projection of the second horizontal electrode plate member onto the base substrate are arranged in the first direction.

8. The scanning driving circuit according to claim 7, wherein the scanning driving circuit further comprises a second voltage signal line extending in the first direction and arranged at a side of the first voltage signal line away from a display region,
   the first node control transistor is arranged between the second voltage signal line and the first voltage signal line,
   the first electrode plate of the second capacitor further comprises a second vertical electrode plate member coupled to the second horizontal electrode plate member, and an orthogonal projection of the second vertical electrode plate member onto the base substrate partially overlaps an orthogonal projection of the second voltage signal line onto the base substrate.

9. The scanning driving circuit according to claim 8, wherein the scanning driving circuit further comprises a first clock signal line extending in the first direction and arranged at a side of the second voltage signal line away from the first voltage signal line, the at least one shift register unit comprises an output circuit,
   the output circuit comprises an output transistor, the at least one shift register unit further comprises a second conductive connection member arranged between a gate electrode of the output transistor and the second electrode plate of the second capacitor and the second conductive connection member is coupled to the gate electrode of the output transistor and the second electrode plate of the second capacitor, the at least one shift register unit further comprises a third conductive connection member coupled to the second electrode plate of the second capacitor, an orthogonal projection of the third conductive connection member onto the base substrate overlaps an orthogonal projection of the first clock signal line onto the base substrate at a sixth overlapping region, and the first clock signal line is coupled to the first electrode plate of the second capacitor through at least one sixth via hole in the sixth overlapping region.

10. The scanning driving circuit according to claim 7, wherein the at least one shift register unit further comprises a second node control transistor and a second capacitor connection transistor, a second electrode of the second node control transistor is coupled to the second electrode of the first node control transistor through the fourth conductive connection member, wherein the at least one shift register unit further comprises a fifth conductive connection member coupled to a gate electrode of the second capacitor connection transistor, an orthogonal projection of the fifth conductive connection member onto the base substrate overlaps an orthogonal projection of the fourth conductive connection member onto the base substrate at a seventh overlapping region, and the fifth conductive connection member is coupled to the fourth conductive connection member through a seventh via hole in the seventh overlapping region.

11. The scanning driving circuit according to claim 10, wherein the at least one shift register unit further comprises an input transistor, a first electrode of the input transistor is coupled to an input signal end, and a second electrode of the input transistor is coupled to a ninth conductive connection member, wherein an orthogonal projection of the ninth conductive connection member onto the base substrate overlaps the orthogonal projection of the second electrode plate of the second capacitor onto the base substrate at a tenth overlapping region, and the ninth conductive connection member is coupled to the second electrode plate of the second capacitor through a tenth via hole in the tenth overlapping region.

12. The scanning driving circuit according to claim 10, wherein the at least one shift register unit further comprises a third node control transistor, a second capacitor connection transistor and an input transistor, wherein a gate electrode of the third node control transistor is coupled to the first clock signal line, an active layer of the input transistor, an active layer of the third node control transistor and an active layer of the second capacitor connection transistor are formed by a continuous third semiconductor layer, the active layer of the input transistor comprises a first one of fifth conductive members, a fifth channel member and a second one of the fifth conductive members arranged sequentially in the first direction, the second one of the fifth conductive members is reused as a first one of sixth conductive members, the active layer of the third node control transistor comprises the first one of the sixth conductive members, a sixth channel member and a second one of the sixth conductive members sequentially arranged in the first direction, the second one of the sixth conductive members is reused as a first one of seventh conductive members, and the active layer of the second capacitor connection transistor comprises the first one of the seventh conductive members, a seventh channel member and a second one of the seventh conductive members sequentially arranged in the first direction.

13. The scanning driving circuit according to claim 2, wherein the scanning driving circuit further comprises a second voltage signal line, a third voltage signal line, a first clock signal line, a second clock signal line and a signal output line, wherein the at least one shift register unit further comprises an output transistor, an output resetting transistor, a second transistor, a first capacitor connection transistor, a second capacitor connection transistor, a first node control transistor, a second node control transistor, an input transistor, and a third node control transistor, wherein a first electrode of the output resetting transistor is coupled to the first voltage signal line, a second electrode of the output transistor is coupled to the third voltage signal line, a second electrode plate of the output capacitor is coupled to a gate electrode of the output resetting transistor, a second electrode of the first transistor is coupled to the second electrode plate of the output transistor, a gate electrode of the first transistor is coupled to a second electrode of the third node control transistor, a second electrode of the second transistor is coupled to a first electrode plate of the first capacitor, a first electrode of the second transistor is coupled to a second electrode of the first capacitor connection transistor, a gate electrode of the second transistor is coupled to a gate electrode of the third node control transistor, a gate electrode of the first capacitor connection transistor and a gate electrode of the second capacitor connection transistor are coupled to a second electrode plate of the first capacitor, the second electrode of the first capacitor connection transistor is coupled to the first electrode plate of the first capacitor, a first electrode of the first capacitor connection transistor is coupled to the gate electrode of the second transistor, a first electrode of the second capacitor connection transistor is coupled to the first voltage signal line, the gate electrode of the second capacitor connection transistor is coupled to a second electrode of the second node control transistor, a second electrode of the second capacitor connection transistor is coupled to a first electrode of the third node control transistor, a first electrode of the first node control transistor is coupled to a gate electrode of the second node control transistor, a gate electrode of the first node control transistor is coupled to a second electrode plate of the second capacitor, the second electrode of the second node control transistor is coupled to a second electrode of the first node control transistor, the gate electrode of the second node control transistor is coupled to the second clock signal line, a first electrode of the second node control transistor is coupled to the second voltage signal line, a gate electrode of the input transistor is coupled to the gate electrode of the second node control transistor, a first electrode of the input transistor is coupled to an input signal end, a second electrode of the input transistor is coupled to the second electrode plate of the second capacitor, the gate electrode of the third node control transistor is coupled to the first clock signal line, a first electrode plate of the output capacitor is coupled to the first voltage signal line, the second electrode plate of the output capacitor is coupled to the gate electrode of the output resetting transistor, the second electrode plate of the second capacitor is coupled to a gate electrode of the output transistor, a first electrode plate of the second capacitor is coupled to the first clock signal line, and a second electrode of the output transistor and a second electrode of the output resetting transistor are coupled to the signal output line.

14. The scanning driving circuit according to claim 13, wherein the first electrode plate of the first capacitor comprises a first horizontal electrode plate member and a first vertical electrode plate member, the output transistor and the output resetting transistor are arranged between the first voltage signal line and the third voltage signal line, the output resetting transistor, the output transistor and the signal output line are arranged sequentially in the first direction, the second voltage signal line is arranged at a side of the first voltage signal line away from the third voltage signal line, the first capacitor, the first transistor, the second transistor, the first capacitor connection transistor, the second capacitor connection transistor, the first node control transistor, the second node control transistor, the input transistor and the third node control transistor are arranged between the first voltage signal line and the second voltage signal line, the first transistor, the second transistor and the first vertical electrode plate are arranged sequentially in the first direction, the input transistor, the third node control transistor, the second capacitor connection transistor and the first horizontal electrode plate member are arranged sequentially in the first direction, the second node control transistor and the first node control transistor are arranged sequentially in the first transistor, an orthogonal projection of the gate electrode of the first capacitor connector transistor onto the base substrate is arranged between an orthogonal projection of the second electrode plate of the first capacitor onto the base substrate and the orthogonal projection of the first voltage signal line onto the base substrate, an orthogonal projection of the gate electrode of the second transistor onto the base substrate is arranged between an orthogonal projection of the gate electrode of the third node control transistor onto the base substrate and an orthogonal projection of the first voltage signal line onto the base substrate, an orthogonal projection of the gate electrode of the first node control transistor onto the base substrate is arranged between an orthogonal projection of the second voltage signal line onto the base substrate and an orthogonal projection of an orthogonal projection of the first electrode plate of the first capacitor onto the base substrate, and a minimum distance between the orthogonal projection of the gate electrode of the first node control transistor onto the base substrate and the orthogonal projection of the second voltage signal line onto the base substrate in the second direction is greater than a minimum distance between an orthogonal projection of the gate electrode of the second capacitor connection transistor onto the base substrate and the orthogonal projection of the second voltage signal line onto the base substrate in the second direction.

15. The scanning driving circuit according to claim 14, wherein an orthogonal projection of the first electrode plate of the output capacitor onto the base substrate overlaps the orthogonal projection of the first voltage signal line onto the base substrate at a signal line overlapping region, an orthogonal projection of the second electrode plate of the output capacitor onto the base substrate partially overlaps the orthogonal projection of the first voltage signal line onto the base substrate, an orthogonal projection of the first electrode plate of the second capacitor is located within an orthogonal projection of the second electrode plate of the second capacitor onto the base substrate, the first electrode plate of the second capacitor is of an L-like shape, the first electrode plate of the second capacitor comprises a second horizontal electrode plate member and a second vertical electrode plate member, the gate electrode of the first node control transistor and the second horizontal electrode plate are arranged in the first direction, and an orthogonal projection of the second vertical electrode plate member onto the base substrate partially overlaps an orthogonal projection of the second voltage signal line onto the base substrate.

16. A display device, comprising the scanning driving circuit according to claim 1.

17. A method of manufacturing a scanning driving circuit, comprising forming a first voltage signal line and a scanning driving circuit on a base substrate, the first voltage signal line extending in a first direction, the scanning driving circuit comprising a plurality of shift register units, at least one of the plurality of shift register units comprising an output capacitor, a first capacitor and a second capacitor, wherein the method further comprises:

forming the second capacitor, the first capacitor and the output capacitor in sequence along a second direction, the second direction being substantially perpendicular to the first direction, wherein an orthogonal projection of the second capacitor on a straight line extending along the second direction forms a first segment, an orthogonal projection of the first capacitor on the straight line extending along the second direction forms a second segment, an orthogonal projection of the output capacitor on the straight line extending along the second direction forms a third segment, the first segment does not overlap the second segment, the second segment does not overlap the third segment;

wherein an orthogonal projection of the first capacitor on a straight line extending along the first direction forms a fourth segment, an orthogonal projection of the second capacitor on the straight line extending along the first direction forms a fifth segment, the fourth segment is within the fifth segment; wherein an orthogonal projection of the output capacitor on the straight line extending along the first direction forms a sixth segment, the fourth segment is within the sixth segment.

* * * * *